United States Patent [19]

Raymond et al.

[11] 4,216,539

[45] Aug. 5, 1980

[54] IN-CIRCUIT DIGITAL TESTER

[75] Inventors: Douglas W. Raymond, Orinda; Thomas C. Garrett, Walnut Creek, both of Calif.

[73] Assignee: Zehntel, Inc., Concord, Calif.

[21] Appl. No.: 903,160

[22] Filed: May 5, 1978

[51] Int. Cl.² .................... G01R 31/28; G06F 11/00
[52] U.S. Cl. .................................. 371/20; 324/73 R
[58] Field of Search ........ 235/302; 324/73 R, 73 AT, 324/73 PC; 364/200, 900; 371/15, 20

[56] References Cited

U.S. PATENT DOCUMENTS

| | | | |
|---|---|---|---|
| 3,076,864 | 8/1963 | Gordon et al. | 235/302 |
| 3,423,677 | 1/1969 | Alford et al. | 324/158 |
| 3,492,571 | 1/1970 | Desler | 324/73 R |
| 3,492,572 | 1/1970 | Jones et al. | 324/73 R |
| 3,541,441 | 11/1970 | Hrutstich | 324/73 R |
| 3,546,582 | 12/1970 | Barnard et al. | 324/73 R |
| 3,549,996 | 12/1970 | Vaughan et al. | 324/73 R |
| 3,621,387 | 11/1971 | Smith et al. | 324/73 R |
| 3,622,876 | 11/1971 | Ure et al. | 324/73 R |
| 3,631,229 | 12/1971 | Bens | 235/302 |
| 3,673,397 | 6/1972 | Schaefer | 235/302 |
| 3,763,430 | 10/1973 | Terrey | 324/73 R |
| 3,764,995 | 10/1973 | Helf, Jr. et al. | 364/200 |
| 3,812,337 | 5/1974 | Crosley | 235/302 |
| 3,812,426 | 5/1974 | Illian | 324/73 R |
| 3,889,109 | 6/1975 | Blessin | 235/302 |
| 3,924,109 | 12/1975 | Jhu et al. | 235/302 |
| 3,924,181 | 12/1975 | Alderson | 324/73 R |
| 3,931,506 | 1/1976 | Borrelli et al. | 235/302 |
| 3,943,439 | 3/1976 | Raymond | 324/60 C |
| 4,000,460 | 12/1976 | Kadakia et al. | 324/73 R |
| 4,001,818 | 1/1977 | Radichel et al. | 324/73 R |
| 4,012,625 | 3/1977 | Bowen et al. | 235/302 |
| 4,039,814 | 8/1977 | Saint-Hilaire et al. | 235/302 |
| 4,044,244 | 8/1977 | Foreman et al. | 235/302 |
| 4,070,565 | 1/1978 | Borrelli et al. | 235/302 |
| 4,097,797 | 6/1978 | Finet | 235/302 |
| 4,102,491 | 7/1978 | DeVito et al. | 235/302 |

OTHER PUBLICATIONS

Gordon and Nadig, Hexadecimal Signatures Identify Troublespots in Microprocessor Systems, Electronics, Mar. 3, 1977, pp. 92–96.

Primary Examiner—Charles E. Atkinson
Attorney, Agent, or Firm—Arnold, White & Durkee

[57] ABSTRACT

An apparatus for the automatic, in-circuit testing of the electrical properties of complex digital integrated circuit assemblies is disclosed. A programmed processor is provided to control a set of selectable switches, which connect selected nodes of a circuit under test to certain ones of a plurality of signal lines. One of the signal lines supplies a selected digital test signal from a set of selectable test signals to the selected node. The set of test signals including a Gray code. Another of the signal lines provides a response line connecting a selected node to a functional tester that performs one of a selectable number of intermediate functional tests. One of the functional tests is a signature analysis of the digital response signal in accordance with a cyclic redundancy check (CRC) coding technique. Each test performed by the apparatus is specified through processor routines which select and encode the proper test signals for the particular circuit or device under test and analyze the results of the intermediate functional tests to determine if the device has functioned properly.

60 Claims, 11 Drawing Figures

IN-CIRCUIT DIGITAL TESTER

BACKGROUND OF THE INVENTION

The present invention relates to a measuring and testing apparatus for testing complex digital circuits; more particularly, to automatic digital in-circuit testers for testing digital circuits containing, but not limited to, large scale integrated circuits.

The in-circuit tester of the type disclosed herein is a tester that is capable of testing a circuit without regard to whether or not the electrical node into which a test signal is injected is connected to the output of another logic device. The disclosed in-circuit tester is capable of generating and applying a digital test signal to an output node of a logic device that is normally at a logic ground, and cause that output to go to a logic high without damaging the device. In other words, the use of the term "in-circuit" means that the device or circuit under test does not have to be isolated or removed from the surrounding circuits in order to apply test signals and to monitor its output.

Printed circuit boards containing complex digital integrated logic circuits interconnected by copper lands to form functional circuits, offer a greater challenge to prior-art in-circuit digital testers than they are able to meet. Prior art testers are able to select interconnection points between the digital components, referred to as the electrical nodes, and to apply test signals to a circuit or to monitor the response of the circuit to those signals. However, ever-increasing complex logic devices, such as micro-processors, are being developed and extensively used by today's circuit designers. Prior-art digital in-circuit testers are not capable of performing the numerous, rapid and varied tests required for such complex circuits.

One of the most significant developments in digital circuit technology in recent years has been the fabrication of large and complex digital circuits on a single chip of semiconductor material using large scale integration (LSI) techniques. These circuits typically contain a great number of transistors and other components which enable the designer to package a greater number of circuits in a relatively small volume. Research and development is underway in the form of very large scale integration (VLSI) for methods to manufacture an even greater number of circuits within a single chip. Where LSI has thousands of transistors per chip, VLSI has hundreds of thousands. As a result of the large number of circuits contained in LSI devices and the expected increases in circuit complexity from VLSI technology, the probability of chip failure has increased. Correspondingly, the importance of testing and diagnosis of chip failures has also increased. However, the prior-art digital in-circuit testers either are not capable of performing the complex tests required, or are too slow, due to the time required to generate all the necessary test signals to test these complex circuits.

Because of the increased packing density of digital circuits and the wide variety of logic functions available, LSI devices are enjoying widespread use in most digital circuits and systems which designers are presently producing. The reliability of such systems and circuits depends greatly on the reliability and accuracy of operation of the LSI devices and, thus, a need has arisen for new and sophisticated equipment and procedures for testing of these circuits. Such testing is relatively difficult because of the great number of different functional sections in each device. The problem is further compounded by the limited number of test nodes available to each integrated circuit for the connection of input and output signals.

Most of the functional sections of the integrated circuits consist of either combinational logic circuits or sequential logic circuits or some combination thereof. A combinational logic circuit is defined as one that consists entirely of gates (AND, OR, etc.). In a combinational logic system, no clock is required, and after the inputs have been established (disregarding settling time), the output is immediately available for checking to determine whether it conforms to the output signal that the circuit should correctly produce in response to the specified input signal. On the other hand, sequential circuits require a sequence of changes in the input test signals, such as a clock, before an output signal, produced in response to the test signals, can be examined to determine if the device correctly responded. Because of the complexity of the digital circuits and the fact that there exists only a limited access to the integrated circuit chip's circuits via the IC pins, many different test signals must be generated before all of the functional capabilities of the LSI device can be checked. In a great many instances, an output signal must be checked as to the pattern of one's and zero's that is produced in response to a known set of input test signals to determine if the chip is working properly.

It is thus apparent that an apparatus for testing circuit assemblies containing LSI circuits must be able to develop and analyze a large quantity of data and test signals. Further, the test apparatus must be adapted to perform tests on a large number of different LSI circuits having widely different transfer functions. To best accomplish this requirement, a computer controlled test system is preferred. The versatility of test programs both to generate the necessary test signals and to analyze the resulting response signals make the computer a necessary element of a test system for digital circuits having LSI devices. Although the computer offers great flexibility in selecting tests to be performed, often the response signal produced by the generated test signals consists of bit streams of data that would require excessive computer storage and execution time to analyze each and every bit so produced. Therefore, a technique of compressing the bit stream down into something that can readily be assimilated by the computer to obtain maximum usage of the computer's capabilities would be desirable. This compression of the long bit streams can be accomplished by using a cyclic redundancy check (CRC) coding technique, which logically combines each bit with those that went before, to generate a compact digital code or signature. This signature represents, almost uniquely, the length and pattern of one's and zero's that occurred. The computer could then compare the measured code against a code for a correct response, to determine if the device is functioning properly.

A limitation of known computer-aided testers is the fact that the computer remains operatively tied into the test circuit during the performance of the test, because it is used as a source of test data. Because many LSI devices require lengthy and complex test signals in order to properly simmulate normal operations of the device, and because of speed limitations imposed by software-generated test signals, these types of computer-aided systems are capable of performing only a limited number of tests on these devices within a given time interval. However, if a computer-aided tester were provided which used intermediate test circuits to generate the test signals and to perform the functional tests, leaving for the computer only the initialization of the tester circuits prior to the test and the analysis of the results following the test, the power and flexibility of the computer could effectively be utilized.

Thus, it would be advantageous to provide a computer-controlled in-circuit digital tester for testing digital circuits employing the complex integrated circuits resulting from LSI technology in which appropriate test signals are generated and functional tests performed by intermediate test circuits, the results of which are analyzed by the computer.

SUMMARY OF THE INVENTION

In accordance with this invention, an automatic, computer-controlled digital in-circuit tester is provided for controlling a test cycle in which digital test signals are generated for a circuit under test. A response signal generated from that circuit in response to the test signals is checked for a proper response. A set of selectable electrical node test pins are provided, to contact the circuit interconnections of the circuit under test. These test pins permit the application of the test signals at selected points of the circuit and the monitoring of a response to those signals. The test signals are applied to the circuit under test through a set of selectable test signal switches associated with each of the test pins. Through processor control, a selected test pin has one switch from its associated set of test switches selected, to either apply a test signal to the test pin or to connect the test pin to a response signal bus. A digital test-signal generator is provided for each set of test switches to generate one signal from a set of selectable digital test signals. Among the set of digital test signals are signals which have the characteristic that identifies them as a Gray code.

A test controller, responsive to the processor, is provided for controlling the generation of a test cycle in which the digital test signals are generated. The response signal generated during the test cycle is monitored by a functional tester to perform intermediate processor selected tests. One of the functional tests is the determination of the signature of the response signal by generation of a cyclic redundancy check code. The result of the functional tests is inputted to the processor, where it is compared to the expected response to determine if the circuit under test has functioned properly.

BRIEF DESCRIPTION OF THE DRAWINGS

For a fuller understanding of the nature and objects of the invention, reference should be had to the following detailed description taken in connection with the accompanying drawings, in which.

Similar reference characters refer to similar parts throughout the several views of the drawings.

DETAILED DESCRIPTION OF THE PREFERRED EMBODIMENT

It will be helpful in understanding the following discussion to define certain logic terms. Each of the logic signals to which reference is made in the following discussions will have one of two possible logic states, a logic 1 or a logic 0. A logic signal will be designated as a true signal without an asteric following the mnemonic. As an example, CLOCK would be a true signal while CLOCK* would be its inverse. Each logic signal, be it the true signal or its inverse, will have an asserted and unasserted state. In the case of CLOCK, a true signal, the asserted state will be a logic 1 and the unasserted state a logic 0. For CLOCK*, the reverse is true, the asserted state is logic 0 and the unasserted state is logic 1. A signal goes "true" when it switches from the unasserted to the asserted state and vice versa when it goes "false." Lastly, a flip-flop is in a logic 0 state when the Q output is at a logic 0 and the Q* is at a logic 1. In the logic 1 state the outputs of the flip-flop are in the reverse states.

Figure 1:
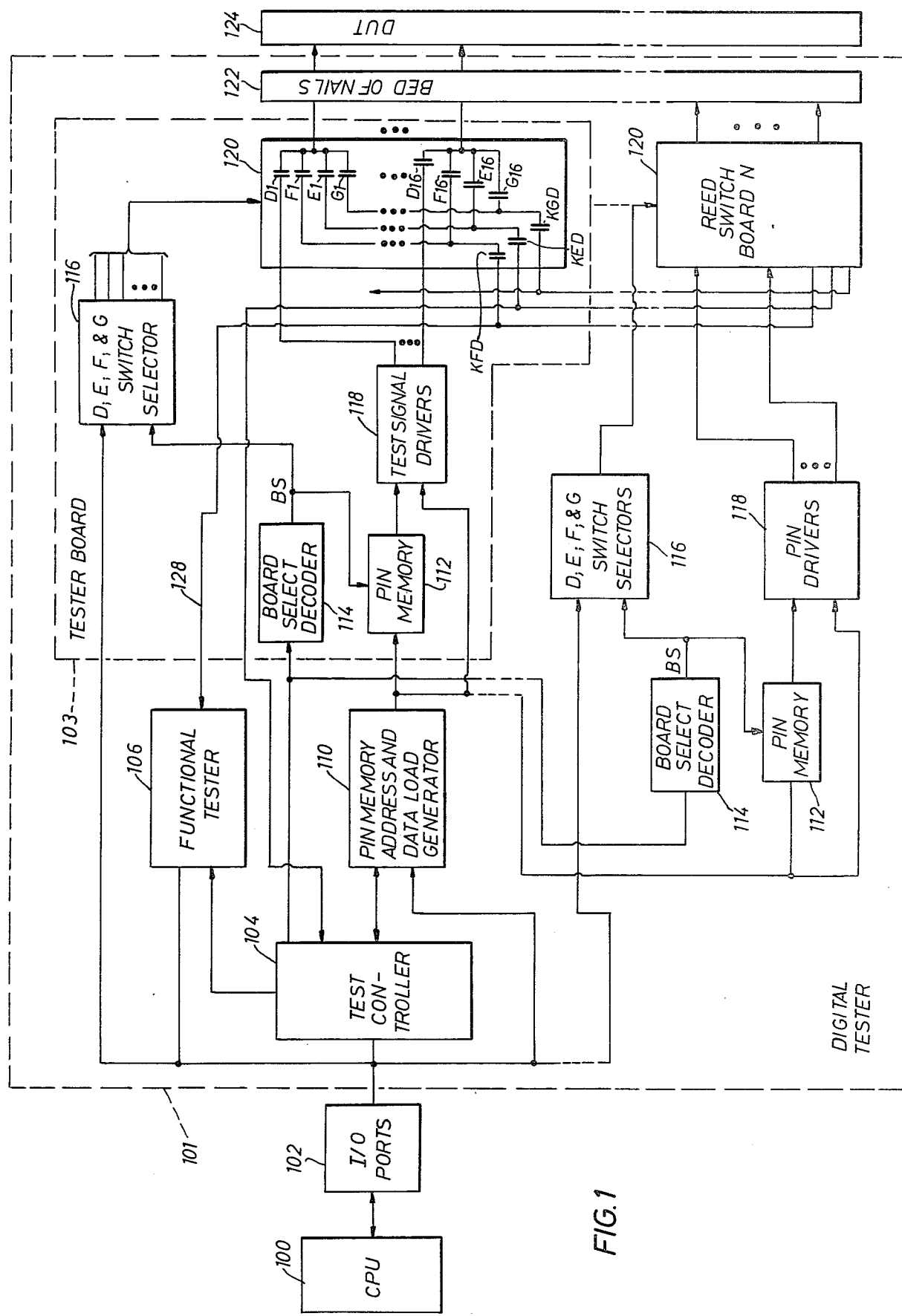
FIG. 1 is a block diagram of the computer-controlled digital circuit tester.

Referring first to FIG. 1, a block diagram of the computer controlled digital in-circuit tester is shown, with a central processing unit (CPU) 100 having a set of input/output (I/O) ports 102 that are used to communicate between the CPU 100 and the remaining circuits of the digital tester. I/O ports 102 contain standard interface circuits for interfacing the CPU 100 to a peripheral device. As used herein, the term "central processing unit" is meant to include all programmable or programmed devices of any size, such as microprocessors, minicomputers, computers, time-share computers, main frame computers, batch processors, data processors, etc.

The digital tester 101, which responds to commands from the CPU 100, is composed of test controller 104, test signal generator 108, functional tester 106, board select decoder 114, D, E, F & G switch selectors 116, reed switches 120 and a bed of nails 122. The bed of nails 122 consists of an array of selectable test pins that are contactable with the circuit interconnection nodes of the logic circuits on the printed circuit board of device under test (DUT) 124. The DUT 124 is a printed circuit board assembly in which the interconnections between the various components are for the most part made with copper lands. Each DUT 124 will have its own preselected array of test pins that form the bed of nails 122 which contacts the interconnection points or electrical nodes of the circuits on the DUT. The test pins that will be used in testing the DUT 124 in each test cycle is selected from the bed of nails 122 and programmed into the processor. The DUT 124 is placed over the bed of nails 122 and a vacuum applied to cause the DUT PC board assembly to move down and contact the test pins in the bed of nails 122. The board is caused to move a sufficient amount to cause the spring loaded test pins to compress. This ensures that the test pins are contacting the interconnection nodes of the DUT 124 with sufficient force to penetrate the copper land.

Each pin in the bed of nails 122 has an associated set of selectable switches, designated as the D, E, F & G switches, connected to it. It should be noted here that the D, E and G switches are provided as a safety feature to protect the digital tester 101 internal circuits from excessive logic voltages that may appear on the electrical nodes of the DUT 124 by isolating each test pin through these switches.

For the digital tester 101 to work, the D, E and G switches do not have to be provided. However, the F switch is provided so that the test pin which will contact the output test signal node can be connected to the response line 128. Therefore, the set of selectable switches associated with each test pin could be as few as one but as many as desired. As shown in FIG. 1, one terminal of each of these selectable switches is connected to the test pin. During each test cycle, each of the selected test pins that contact the DUT 124 can either conduct an input test signal to the DUT or can conduct the selected output signal for the DUT, or it can alternately do both. If the selected test pin is to input an input test signal, the switch will be selected. The terminals of the E and G switches for each of the test pins that is not connected to its associated test pin are bussed together, respectively. The E switch selects the EXT CLOCK signal from the DUT to be applied to the master clock generator 706 (see FIG. 7(a)). The F switch selects the node of the DUT that is to be the response signal and applies it to the functional tester 106 (see FIG. 7(a)). Each test pin in the bed of nails 122 has the capability of applying a preselected digital test signal to DUT 124 through its D switch when the switch is selected. Each test pin has an associated digital test signal generator whose output can be connected to the test pin through a D switch.

If the test pin is to be connected to the electrical node that is the output signal for the circuit under test, switch F is selected. The F switches for each of the test pins in the bed of nails 122 are also bused together to form the response signal line 128. Response signal line 128 is inputted to the functional tester 106, where one of four functional tests is performed. Because of the large number of test pins available in the bed of nails 122 (for the preferred embodiment 1,024 pins), practical considerations of constructing the tester require that the test pins be grouped into smaller subsets on boards to accommodate the circuits required to contain the D, E, F & G switches, to select the appropriate ones of those switches for each test pin used in the test, and to generate the digital test signals for the test. These circuits are chosen for inclusion in the subsets because they are duplicated for each test pin in the bed of nails 122.

For the preferred embodiment, the bed of nails 122 is divided into groups of sixteen test pins. Within each group, the E, F and G switches are bussed together. Further, the bussed E, F and G selectable switches are connected to buses between the groups of sixteen test pins through selectable switches KFD, KED, and KGD. These selectable switches, KFC, KED and KGD, provide isolation for the internal bussing of the sixteen test pins from the external bussing between the groups of switches. But, in any event, each E, F and G switch for each test pin is connectable to the same bus.

The circuits required to generate sixteen separate digital test signals for each of the sixteen test pins in the subset, to select which of the four selectable switches for each test pin that is to be used during the test cycle, and to contain the actual reed switches and their coil drivers to provide the D, E, F and G contacts, are mounted on a single PC board assembly. Thus, for the preferred embodiment, a total of 64 boards are required for a bed of nails of 1,024 test pins. As shown in FIG. 1, each PC board assembly 103 containing the above described circuits is composed of a pin memory 112, test signal drivers 118, a board select decoder 114, D, E, F & G switch selectors 116, and reed switches 120.

Still referring to FIG. 1, the digital tester is used as follows: A circuit diagram of the device to be tested is examined to identify the circuits or chips that are to be tested. In general, all nodes will be contacted by a test pin, even unused elements of the integrated circuits. The electrical nodes that are to be used in a test cycle as either an input node or as the circuit under test response node are identified and assigned the number that corresponds to the test pin number that will contact that node when the board assembly is placed on the bed of nails. Knowing how the circuit under test is intended to work, computer routines are generated that will, when executed by the computer, cause the tester to generate appropriate test signals to the electrical nodes of the circuit under test. The tester 101 circuits will monitor the response signal and perform intermediate tests on the signal. Under computer control, the tester 101 will transmit the results of the intermediate tests to the computer, where a comparison between the measured response and the expected response determines if the circuit has functioned properly.

Each integrated circuit in the circuit under test is tested during a test cycle defined to be that period during which the digital test signals are actually being applied to the circuit under test. Although all of the test parameters are specified by computer software, the actual tests are carried out, for the most part, independently of control of the computer. That is, the computer specifies the type of test that is to be performed, the length of the test cycle, the types of test signals that are to be generated, the test pins to be selected, etc., prior to initiation of the test cycle. Once the test cycle is initiated, the CPU 100 must wait until the test cycle is finished before it acquires the results of the intermediate tests. As a result, the CPU supplies the digital tester 101 with the initial conditions for the test to be performed, before it causes the test cycle to begin.

The CPU 100, acting through I/O ports 102, initialize the circuits of tester 101 prior to a test cycle, by sequentially addressing each test pin that is to be used in testing of the circuit under test, and selects and latches at least one of the D, E, F or G switches for each of those selected test pins. Where appropriate, the KFD, KED and KGD switches are also selected and latched. Having selected and closed a switch for each test pin that will apply a test signal to an input node of the circuit under test, and having selected and closed the F switch of the test pin that will be the response signal, the CPU 100 next sequentially transfers to the pin memories 112 the data necessary for the digital test signal generators to generate the appropriate selected test signal for the selected nodes of the circuit under test. Pin memory address and data load generator 110, in response to commands and data from the cPU 100, stores digital data in pin memory 112. This data, when read during the test cycle, generates a pattern of one's and zero's on the input of test signal drivers 118. In response to the pattern, the drivers 118 generate the digital test signals that are applied to the selected test pins through their closed D switches.

To complete the initialization of the tester 101, the CPU 100 strobes into test controller 104 the parameters which specify: (1) Whether an internal or an external clock reference signal is to be used to generate the digital tester 101 system clock; (2) data which determines the frequency of the system clock derived from the selected reference clock; (3) which of the intermediate tests is to be performed on the response signal; (4) the length of the test cycle that is to be performed; (5) the time during the test cycle in which the response is tested and the time during which the response is ignored; and (6) data to generate a threshold voltage which enables the digital circuit tester to interface to a wide range of logic voltage levels from different DUT's.

Having initialized the circuits of tester 101, the CPU 100 may now initiate a test cycle by issuing the appropriate command to the test controller 104. At the completion of the test cycle, the CPU 100 transmits a command to the tester 101 to transfer the contents of the functional tester to the computer. A comparison is then made between the actual result that would have been produced from a properly functioning circuit, to determine if the circuit is working. The preceding discussion has been given to explain how the tester is used, so that the following detailed description of the circuits which implement the above-described functions may more readily be understood.

Figure 7A:
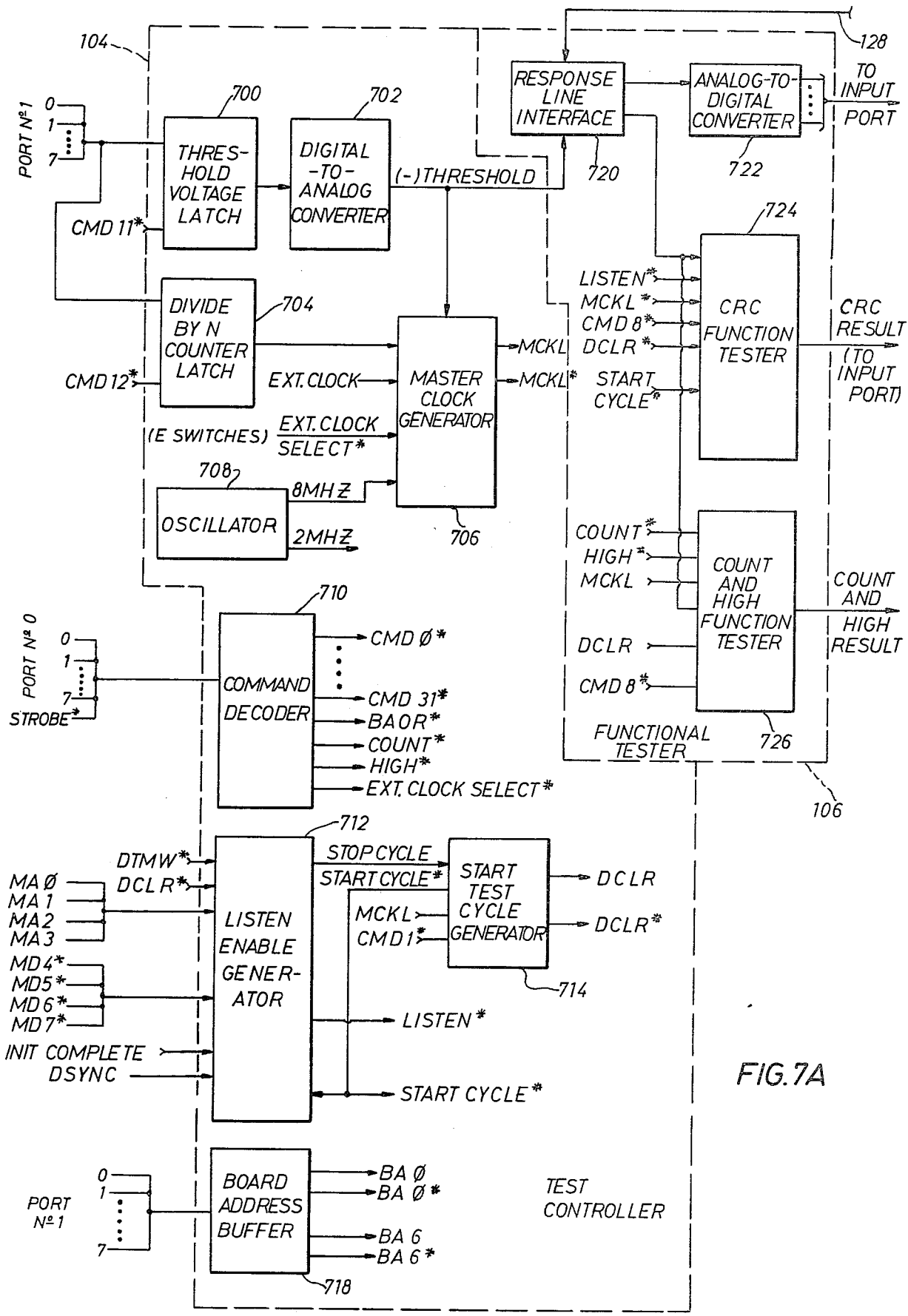
FIGS. 7(a) and 7(b) are block diagrams of the test controller, the D, E, F & G switch selector and the functional tester.
Figure 7B:
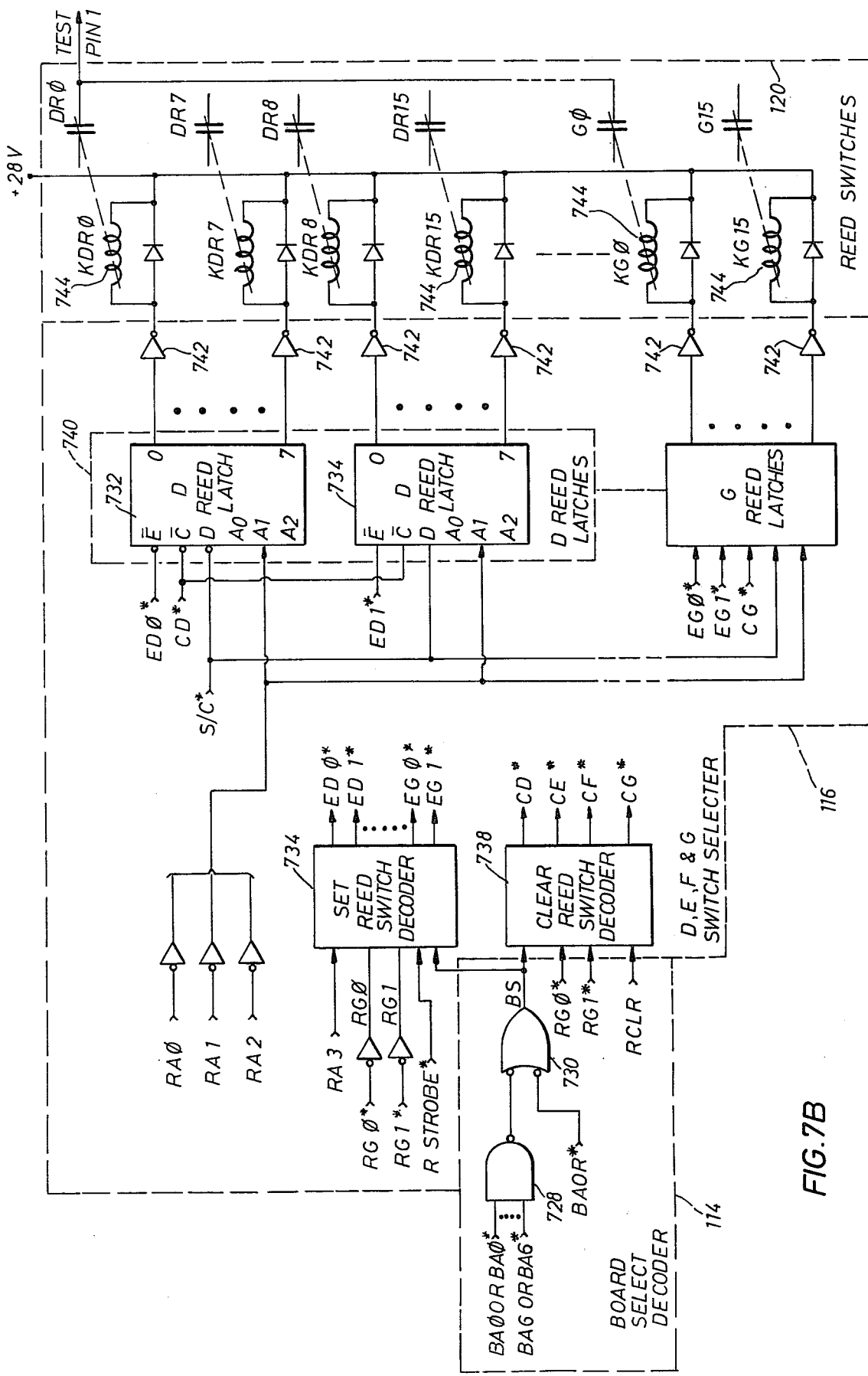

Shown in FIG. 7(*b*) are board select decoder 114, D, E, F & G switch selectors 116 and reed switches 120, which function to select and close one or more of the four selectable reed switches for the test pins used during the test cycle. Board select decoder 114 and D, E, F & G switch selectors 116 function as the switch-selecting means for selecting which reed switch is to be closed during the test cycle. A 8-input NAND gate 728 decodes the board address signals, BA0 through BA6 and their inverse, to generate the board select signal BS if this board is selected.

Each slot of the digital tester into which a board is to be plugged has a unique address assigned to it. As previously discussed, each board contains the circuits for sixteen test pins. This board address is encoded into the connector wiring for the slot, such that the appropriate board address signal (BA0 through BA6 or its inverse) is applied as one input to NAND gate 728. The output of NAND gate 728 is OR'ed in NOR gate 730 with a board address override signal (BAOR)* to generate the signal BS. The signal BAOR* is generated when a board select signal is to be generated on all of the boards simultaneously. The board address signals are generated by the test controller 104 in response to commands and data from CPU 100. CPU 100 also generates reed addresses (RA0 through RA3) and reed group addresses (RG0* and RG1*) which D, E, F and G switch selectors 116 decode, to select, for each of the sixteen test pins on the addressed board, one of the four selectable switches.

Reed addresses RA0 through RA3 and reed group addresses RG0* and RG1* are inputted to D, E, F and G switch selectors 116 to address a plurality of latches, to both store and reset the selection of the selectable switches. The RG0* and RG1* signals are decoded to select one of the four selectable switches (D, E, F or G), and the address signals RA0 through RA3 are decoded to select one of the sixteen test pins on a board. Since the selection process for the D, E, F & G reed switches is the same, only an explanation for the selection of the D switches will be given.

Still referring to FIG. 7(*b*), in the clearing process for the D reed latches 732 and 734, a BS signal, when true, enables clear reed switch decoder 738, so that the reed group addresses, on the occurrence of RCLR* from CPU 100, generate one of four possible reed switch clear signals: CD*, CE*, CF*, or CG*. For clearing of the D reed latches 732 and 734, the signal CD* is generated. This signal is applied to the clear input of the latches 732 and 734 to clear any latches that were set from the previous test cycle.

In the reed switch selection process, reed addresses RA0 through RA2 provide a three bit octal address for latches 732 and 734. Reed address RA3, in conjunction with the reed group signals RG0 and RG1, are decoded by set reed switch decoder 736, on the occurrence of R STROBE*, to generate four pairs of enabling signals, ED0* and ED1* through EG0* and EG1*, with each pair selecting the pair of reed latches for each of the four selectable switches for each test pin. In other words, for the D switches, enabling signals ED0* and ED1* are generated to enable reed latches 732 and 734, respectively. With the set/clear* (S/C*) signal at a logic one, the individual latch addressed by the reed addresses RA0 through RA2, in conjunction with the enable signal from set reed switch decoder 736, loads a selection command into the addressed latch. The outputs from D reed latches 732 and 734 are applied to relay drivers 742 to energize the selected D reed switch. In this manner, each of the selectable switches associated with each of the test pins may be selected and latched closed prior to the start of the test cycle.

Again referring to FIG. 1, test signal generator 108 is shown, composed of pin memory address and data load generator 110, pin memory 112 and test signal drivers 118. Identical pin memory 112 and test signal driver 118 circuits are contained on each of the tester boards in the digital tester 101. The output from pin memory address and data load generator 110 is bussed to each of the pin memory 112 and test signal drivers 118 contained on each of the system tester boards. Pin memory 112 responds to the board select signal BS to enable the data on the bus from pin memory address and data load generator 110 to be inputted to the selected board. In this way, the circuits for pin memory address and data load generator 110 do not have to be duplicated for each board in the tester in order to generate a digital test signal for each test pin. The function of the test signal generator 108 is to generate, during the test cycle, one of the digital test signals from the set of selectable test signals that includes the Gray code set of signals. Since the operations of pin memory address and data load generator 110, pin memory 112 and test signal drivers 118 are identical for each of the tester boards, only a discussion of one will be given.

Figure 2:
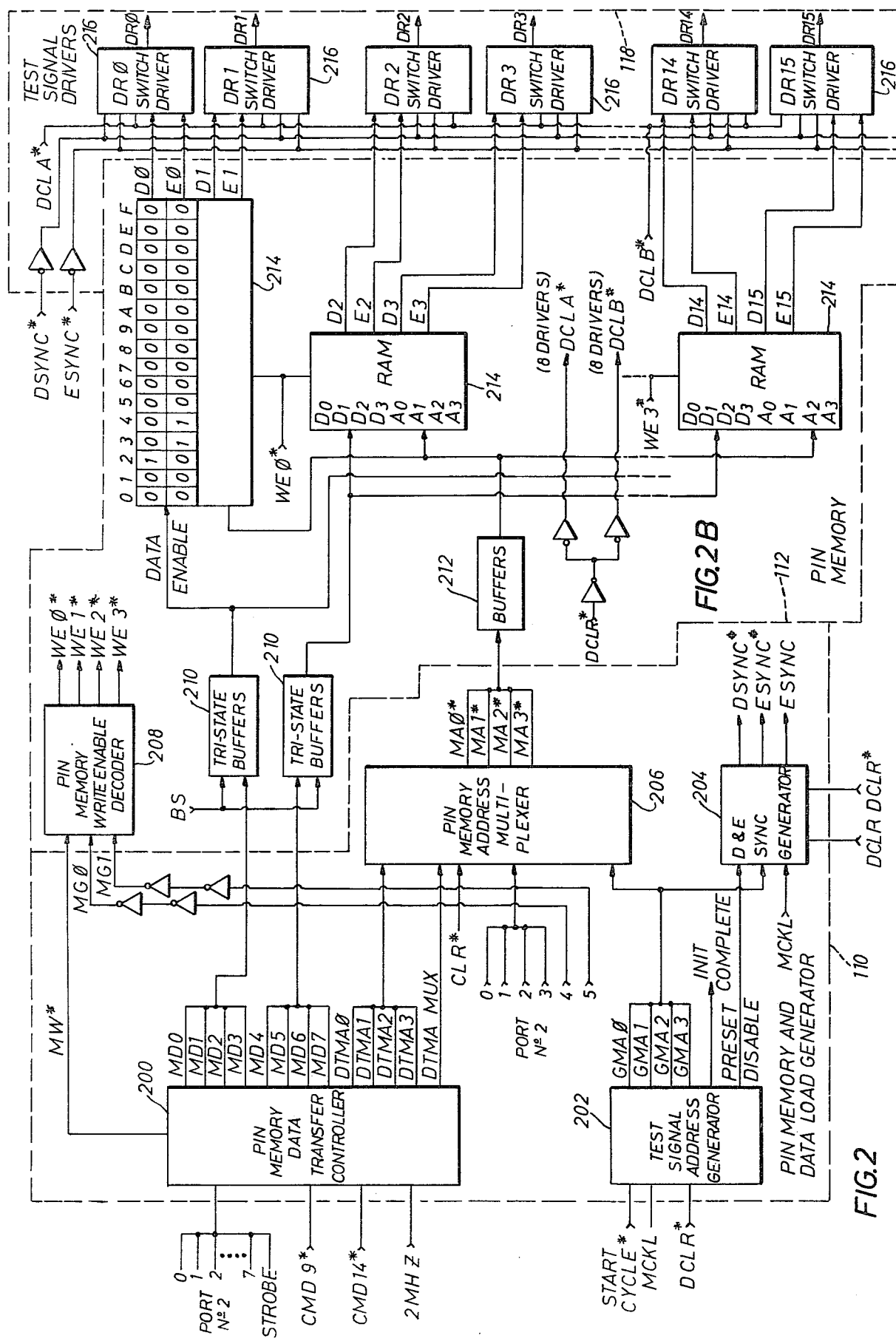
FIG. 2 is a block diagram of the test signal generator.

Referring now to FIG. 2(*a*) and 2(*b*), which illustrates a typical test signal generator 108, pin memory address and data load generator 110 is shown, composed of pin memory data transfer controller 200 test signal address generator 202, D and E sync generator 204, and pin memory address multiplexer 206. The function of the pin memory address and data load generator 110 is to generate memory addresses and memory data for pin memory 112. Pin memory addresses are generated at two different times. First, prior to a test cycle, data must be transferred and stored in pin memory 112 that will generate the digital test signal to be applied through the selected D switches for each of the selected test pins to the circuit under test. Second, during the test cycle, addresses must be generated to pin memory 112 to read the contents of the memory to generate the desired test signal.

The pin memory address and data input signals which program the pin memories 112 prior to a test cycle are generated by the pin memory data transfer controller 200. Pin memory data transfer controller 200, responding to inputs from CPU 100, generates an 8-bit data word on memory data lines MD0 through MD7. These data lines are inputted to pin memory 112 where tri-state buffers 210, enabled by the BS signal for this board, pass the data to the input of the memories 214. At the same time, pin memory data transfer controller 200 generates a set of data transfer memory addresses, DTMA0 through DTMA3, which are inputted to pin memory address multiplexer 206. Additionally, pin memory data transfer controller 200 generates two control signals, write enable MW*, and data transfer memory address mux, DTMA MUX. The signal DTMA MUX is inputted to pin memory address multiplexer 206 to cause the data transfer memory address lines to be multiplexed onto the memory address lines MA0* through MA3*, which form the input address lines for the memories 214. The control signal MW* is inputted to the pin memory write enable decoder 208, to enable a write cycle to the memories 214. Also inputted to pin memory write enable decoder 208 are the memory group addresses MG0* and MG1*. The two addresses are inputted directly to decoder 208 from the CPU 100 through I/O ports 102 to generate WE0* through WE3* in the pin memory write enable decoder 208.

Each of the memories 214 is able to generate digital test signals for two of the D selectable switches. Thus, for a total of sixteen selectable D switches per board, 8 memories are required. The devices that are used in the preferred embodiment of the invention for the pin memories are 16×4 bit random access memories such as a 74LS189 manufactured by National Semiconductor, Inc. It will be appreciated by those of ordinary skill in the art that memory devices of different storage capacity could be substituted for the memories used in the preferred embodiment, such as four 16×1 memory chips. Therefore, each pin memory requires four bits of data input and four bits of address input to address and store data in each of the addressable memory locations.

Since the data lines from pin memory data transfer controller 200 total 8, two memories or two test signal generators are programmed at the same time. Therefore, by bussing a write enable signal to two consecutive pin memories, only four pin memory write enable signals need be generated. The function of pin memory write enable decoder 208 is to generate those four write enable signals. The memory group address lines MG0 and MG1 specify which of the four groups of two-pin memory chips are to be enabled, and when MW* is true, decoder 208 generates one of the four pin memory enable signals WE0* through WE3* specified by MG0 and MG1.

Test signal address generator 202, responding to a START CYCLE* from test controller 104, generates the Gray code memory address lines, GMA0 through GMA3, which are also inputted to pin memory address multiplexer 206. These address signals are generated during a test cycle to address and output the contents of the memories 214, to generate the test signal which the D selectable switches will apply to the circuit under test. The Gray code memory addresses are multiplexed on to the memory address lines MA0* through MA3* by pin memory address multiplexer 206, when the system DCLR* signal and the control signal from pin memory data transfer controller 200, DTMA MUX, are both unasserted. A third mode of addressing the pin memories is also possible. This occurs when both the control signal DTMA MUX and DCLR* are at a logic 0. For this condition, CPU 100 delivers the memory address lines directly from one of the I/O ports 102 to pin memory address multiplexer 206. That address then appears on the memory address lines MA0* through MA3*.

When a test cycle begins and Gray code memory addresses are generated by test signal address generator 202, D sync and E sync generator 204, in response to these addresses, generates the synchronization signals DSYNC* and ESYNC*. These two synchronization signals are used by the test signal drivers 118 in the generation of the digital test signals that are applied to the DUT via the D selectable switches.

Figure 4:
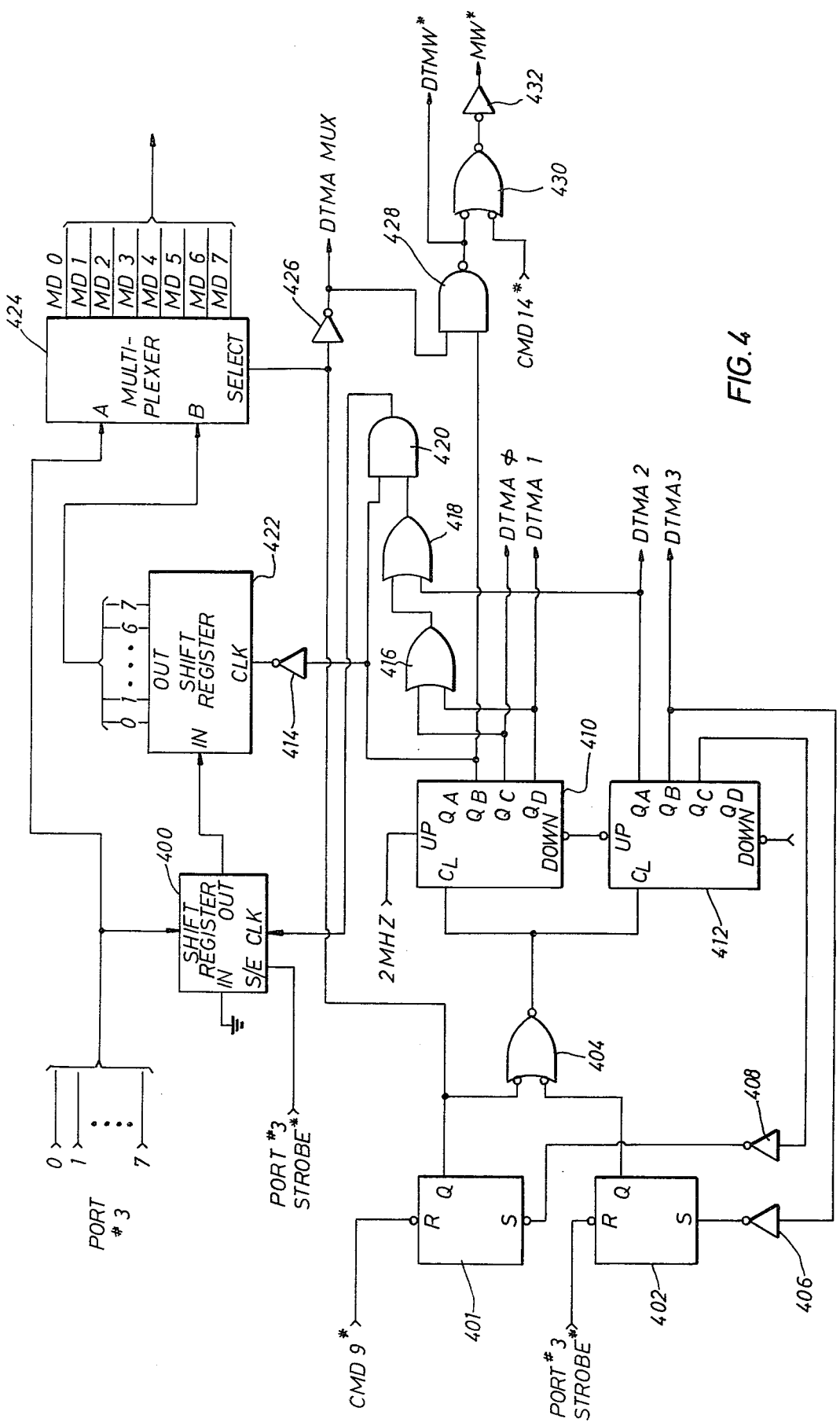
FIG. 4 is the circuit diagram of the pin memory data transfer controller.

Referring now to FIG. 4, which shows the circuit diagram for pin memory data transfer controller 200, system commands CMD2* and CMD3*, generated in test controller 104, are used to select one of two operating modes for the controller 200. In the first mode, data transfer controller 200 can pass the 8-bits presented by CPU 100 via I/O ports 102 to the memory data lines MD0 through MD7; or, in the second mode, controller 200 may accumulate sixteen consecutive 8 bit data values from the CPU before that data is placed on the memory data lines. To operate in the first mode, system command CMD14* is asserted. This signal is inputted to NOR gate 430, whose output is inverted by gate 432 to generate MW* which, as previously discussed, enables pin memory write enable decoder 208 (see FIGS. 2(a) and 2(b)) to write the 8 bits into the memories 214. With the assertion of CMD14*, the data that is presented by CPU 100 to the "A" inputs of multiplexer 424 is muxed onto the memory data lines and strobed into the pin memories 214 enabled by one of the four write enable signals, WE0* through WE3*, generated on the output of pin memory write enable decoder 208.

For the first mode of operation, the output of pin memory address multiplexer 206, MA0* through MA3*, is derived from an address specified by CPU 100 on the data lines of one of the output ports of I/O ports 102. The signal DTMA MUX is not asserted in this mode, but the signal DCLR* is. Therefore, pin memory address multiplexer 206 is selecting the data lines from one of the I/O ports 102 output ports to generate the memory address lines. For each 8 bit data word that is to be strobed into the pin memories, a CMD14* signal must be asserted.

For the second mode of operation of data transfer controller 200, in which sixteen consecutive 8 bit data words will be stored before transferring to the memories 214, two steps must occur. First, each 8 bit data word must be strobed into an 8 bit shift register 400, and second, the contents of shift register 400 must be transferred into 16×8 bit shift register 422, which is acting as the buffer storage device. When shift register 422 is full, system command CMD2* is asserted to initiate the sequence of transferring the contents of shift register 422 through multiplexer 424 onto the memory data lines. For each 8-bit data word that is supplied from I/O ports 102 output port number 3 to the input of shift register 400, PORT 3 STROBE* is asserted to strobe the 8-bit data word into the shift register 400. At the same time, PORT 3 STROBE* resets set-reset flip-flop 402 to a logic zero. The Q output from flip-flop 402 is inputted to NOR gate 404, whose output switches to a logic zero and removes a clear signal to cascaded binary counters 410 and 412. Removing the clear signal to these two counters enables them to begin counting a 2 MHZ internal clock generated by test controller 104. The $Q_C$ and $Q_D$ outputs from counter 410 and the $Q_A$ output from counter 412 are decoded in OR gates 416 and 418 to provide an enabling signal when any one of these three signals is true. This enable signal is inputted as one input to AND gate 420. The other input of AND gate 420 is the $Q_B$ of counter 410, which is the highest frequency signal on the Q outputs of counters 410 and 412 that are used by controllers 200. As a result, the output of gate 420 generates 7 shift pulses to shift register 400 when the enable signal on the output of OR gate 418 is at a logic 1. Inverter 414 inverts the $Q_B$ of counter 410 to generate 8 shift pulses to shift register 422. Because shift register 400 is presenting one of the 8 data bits to the input of shift register 422 before the generation of any shift pulses, only 7 shift pulses are required by register 400 to input all 8 bits to register 422; while 8 pulses are required by register 422 to load that data.

When the output of NOR gate 404 removes the clear signal to the binary counters 410 and 412, they begin to generate output signals each of which is half the frequency of the previous output signal. Thus, selecting three successive outputs would generate 8 possible states, selecting 4 successive outputs would generate 16 possible states, etc. Using this technique, the $Q_B$ output of counter 410 generates 8 cycles from the time the enable signal from gate 418 went true until the $Q_B$ output of counter 412 goes true. In this manner, the 8 bit data word that was strobed into shift register 400 by PORT 3 STROBE* is serially clocked into shift register 422. When the $Q_B$ output of counter 412 goes true at the end of the eighth shift pulse to shift register 422, set-reset flip-flop 402 is set to a logic one. This causes NOR gate 404 to once again assert a clear pulse clearing counters 410 and 412 back to a counter of 0. Thus, in the second mode, the above-described sequence is repeated for sixteen consecutive 8 bit data words.

When shift register 422 contains sixteen 8 bit data words, asserting CMD 9* initiates the transfer of the contents of shift register 422 to the memories 214 (see FIGS. 2(a) and 2(b)). With the assertion of CMD 9*, set-reset flip-flop 401 is cleared to a logic zero. This causes NOR gate 404 to remove the clear signal to the binary counters 410 and 412. Also, the Q output of flip-flop 401 causes the 8 bit multiplexer 424 to select the output from shift register 422 applied to its "B" inputs, as the source of the data for the memory data lines MD0 through MD7. Inverter 426 inverts the select line of multiplexer 424 to generate the control signal DTMA MUX that is used by the pin memory address multiplexer 206 (see FIG. 2(a)) to enable the data transfer memory address lines DTMA0 through DTMA3, generated by counters 410 and 412, to be multiplexed onto the memory address lines MA0* through MA3*. The signal DTMA MUX is ANDED with the $Q_B$ output of counter 410 by NAND gate 428 to generate MW* on the output of inverter gate 432. Thus, a write enable clock is generated for each memory address specified by the data transfer addresses DTMA0 through DTMA3 to store in the memories 214 the 8 data bits multiplexed onto the memory data lines MD0 through MD7 from shift register 422.

The above sequence continues until sixteen 8 bit data words from shift register 422 have been transferred to the pin memories. At the completion of the transfer, the $Q_C$ of counter 412 goes true causing interter gate 408 to set flip-flop 401 to a logic 1. This causes NOR gate 404 to once again assert a clear signal to the counters 410 and 412. Because the $Q_C$ output of counter 412 initiates the clear signal, the $Q_B$ output of counter 410 will generate 16 cycles before the counting is stopped. Thus, when $Q_C$ goes true and initiates the clear to counter 410 and 414, the sequence of transferring the sixteen 8-bit data words to the memories 214 is complete.

Referring now to FIG. 2(b), which is a block diagram of pin memory 112 and pin drivers 118, the contents of memory 214 used to generate one of the Gray code test signals are shown as a sequence of ones and zeros stored in the sixteen memory locations. Shown above each of the bit memory locations is the pin memory address, in hexa-decimal notation, that will produce on the memory output data and enable lines, D0 and E0, the bit contained in the memory locations shown below the address.

The generation of a digital test signal which are applied to the contacts of the selectable D switches from data contained in the contents of memory 214 are the same, and only a discussion of one will be given. Still referring to FIG. 2(b), the sequence of ones and zeros produced on the output by the addressing of memory 214 during a test cycle is inputted to the DR0 switch driver 216. The output signal from this driver is the digital test signal that drives the DUT via the selectable DR0 switch. The character of the digital test signal that is generated from the data stored in memory 214 is controlled by the sequence of addresses with which the memory 214 is addressed. Two memory 214 output signals are required to generate a digital test signal, one called the data bit; the other the enable bit. The data bit is the output signal from memory 214 that is lbeled D0, while the enable bit is the output labeled E0. As will more fully be discussed below, each memory location, from memory address 1 through E, can select a different wave form from the set of Gray code wave forms to be generated by the DR0 switch driver 216.

Figure 3:
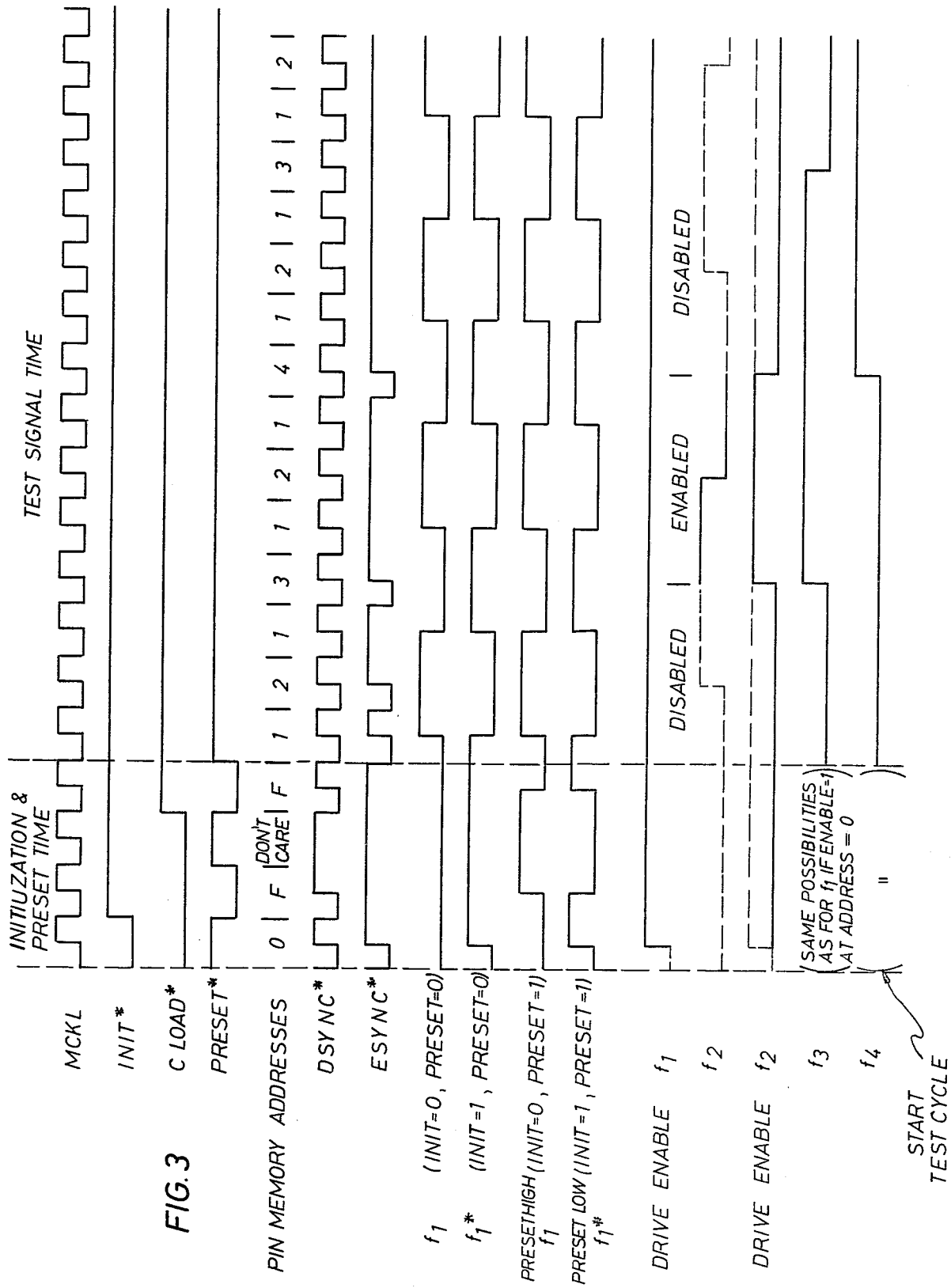
FIG. 3 is the timing diagram for the set of selectable Gray code digital test signals.

Turning now to FIG. 3 and still referring to FIG. 2(b), the test signal timing diagram is illustrated for various selectable Gray code test signals, each signal including an initialization and preset portion. There are sixteen addressable memory locations in memory 214. The contents of the memory 214 for addresses 0 and F control the initialization and preset portion of the digital wave form. The initialization and preset portion of the digital wave form is generated at the start of a test cycle. With two of the memory 214 storage locations used up for the initialization and preset data, only fourteen Gray Code test signals can be specified by the remaining memory locations. This number, of course, can be increased or decreased by increasing or decreasing the memory capacity of memory 214. It is the distinguishing characteristic of a Gray code set of wave forms that, when all the waveforms are viewed simultaneously, for any given cycle of a clocking wave form which generates the digital signals, only one signal will have a transition from one logic level to the other. In other words, no more than one transition in all the wave forms that comprise the Gray code occur for any given clock cycle. To select one of the Gray code test signals, a "1" is recorded in pin memory 214 at the address that corresponds to the desired wave form, and zeros are recorded at the other addresses. Thus, for wave form number 2, a 1 is recorded in memory location 2; or for wave form number 13, a "1" is recorded in memory location D.

In addition to the fourteen Gray Code test signals that can be generated from data stored in memories 214, other digital test signals are possible, such as logic high, logic low, preset high (a single positive pulse at the start of the test cycle), preset low (a single negtive pulse at the start of the test cycle) and the many permutations that are possible in the basic Gray Code signals that are generated by the use of the initialization and preset data a long with the enable data recorded in the enable portion of memory 214. An example of just such a permutation is illustrated in FIG. 3 as signal $f_2$. The following is a discussion of how the data in memory 214 generates the digital test signals.

Shown in FIG. 3 is a portion of the sequence of pin memory addresses that are generated during a test cycle. Also illustrated in FIG. 3 are the digital test signals that are generated on the output of DR0 switch driver 216, according to the data on the D0 and E0 output lines of the pin memory 214. A transition in the output digital test signal from DR0 switch driver 216 is permitted each time that a 1 is outputted on the D0, line provided that the E0 line has previously or is concurrently outputting a one. Referring to FIG. 3, the four waveforms $f_1$, $f_1^*$, preset high $f_1$, preset low $f_1^*$ are shown. Disregarding the initialization and preset portion of those waveforms, it can be seen that on each occurrance of memory address 1, a transition in $f_1$ occurs. As will be discussed below, the DRIVE ENABLE $f_1$ signal can modify the illustrated waveforms for $f_1$; but for the $f_1$ waveforms shown in FIG. 3, DRIVE ENABLE $f_1$ went true during the initialization portion of the test cycle.

For the initialization and preset time of the test cycle, the sequence of pin memory addresses is, in sequence, address 0, address F, an address designated as "don't care", and once again, address F. The address designated as "don't care" is so labeled because regardless of what address is generated by test signal address generator 202, signals DSYNC and ESYNC are absent, as nothing is permitted to happen in the DR0 switch driver 216 to cause a change in the generated test signal. Illustrated in FIG. 3 for the wave forms $f_1$ and its derivatives showing the four possibilities for the initialization and preset portion. The generation of these four wave forms is possible for each of the fourteen Gray Code test signal. For the wave forms illustrated, the signal DRIVE ENABLE $f_1$ was asserted at address 0 in the initialization and preset portion of the test cycle by having a "1" recorded in the enable portion of memory 214 at address 0. A different result would have occurred had the enable bit been stored in a different memory location. This result is illustrated for the wave form $f_2$ in which the enable portion of memory 214 has a "1" recorded in location 3 and location 4. The result of two 1's recorded in the enable portion of the memory 214 is an enabling of the DR0 switch driver 216 on the first occurrence of a "1" on the E0, and a disabling of $f_2$ on the second occurrence of a "1" on E0.

The illustrated wave form $f_2$ in FIG. 3 is the signal generated from the data that is shown as stored in memory 214 in FIG. 2(b). On the first occurrence of the memory address 3, DRIVE ENABLE $f_2$ is asserted and on the first occurrence of address 4, DRIVE ENABLE $f_2$ is cleared. The dotted wave forms that are shown for the signals $f_2$ and DRIVE ENABLE $f_2$ are the signals that would have been generated had there only been a "1" stored in the enable bit address location 0. As illustrated in FIG. 3, a transition in the DRIVE ENABLE f signals occur on the first occurrence of a pin memory address with a "1" stored in the enable portion of memory 214 for that address rather than on every occurrence of that address. This is because the illustrated clocking signal (ESYNC) in FIG. 3 which clocks the transitions in the enabling flip-flop 602 (see FIG. 6 and the discussion below) has been selected to occur only on the first occurrence of a pin memory address. A more detailed discussion of the possible variations in the generation of the clocking signal ESYNC is given in the discussions of the D sync and E sync generator 204.

Figure 5:
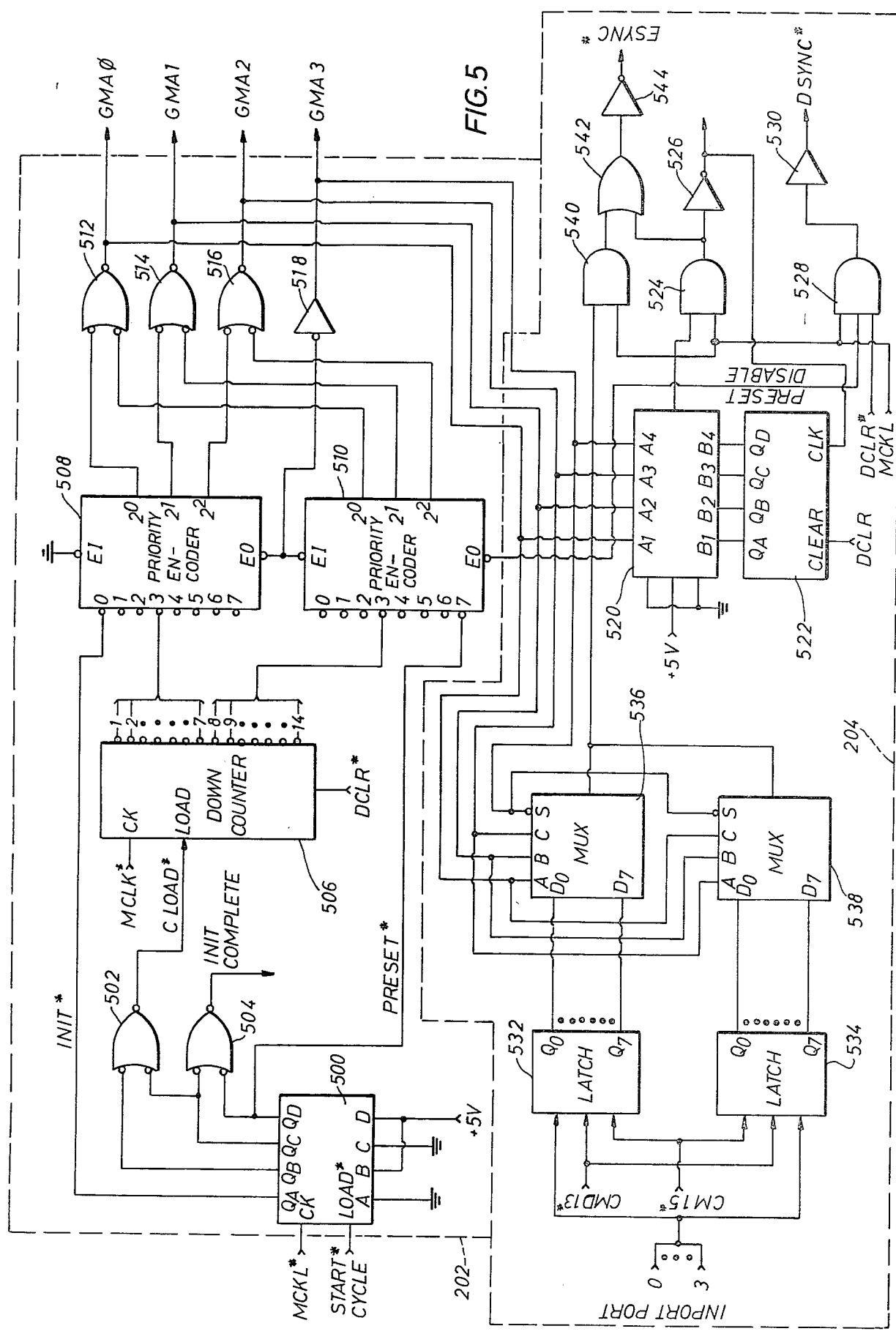
FIG. 5 is a circuit diagram of the test signal address generator and the D & E sync generator.

Still referring to FIG. 3, refer also to FIG. 5 which is the circuit diagram of the test signal address generator 202 that generates the sequence of pin memory addresses as illustrated in FIG. 3. With the assertion of START CYCLE*, shift register 500 is loaded with a bit pattern that produces on the $Q_A$ through $Q_D$ outputs, 0101, respectively. For four consecutive cycles of the system clock MCKL*, the signals INIT*, CLOAD*, and PRESET* are generated. These three wave forms are shown in FIG. 3. The signal CLOAD* loads a fourteen bit binary down counter 506 with an all 1's pattern. Counter 506 is formed from the cascaded connection of four four bit binary down counters (not illustrated). The output of counter 506 is inputted to the three-bit cascaded priority encoders 508 and 510 along with the signals INIT* and PRESET*. The outputs from encoders 508 and 510 are logically combined in NOR GATES 512, 514, 516 and inverter 518 to generate the Gray code memory address signals GMA0 through GMA3, which are inputted to pin memory 206 (see FIG. 2(a)). Down counter 506 counts down from an all 1's or maximum count to a count of 0. When counter 506 reaches a count of 0, one complete cycle of the Gray code test signals is complete. If more than one cycle of the Gray code signals are desired, the signal DCLR* from test controller 104 is not asserted, and down counter 506 continues to count down from a count of 0 to the next count which is once again an all 1's count to begin the next cycle. However, for this and each subsequent cycle in the Gray code signals, no initialization or preset addresses, 0 or F, will occur.

Two clocking signals are generated by the D and E sync generator 204 to be used by the test signal drivers 118 to generate the digital test signals on the output of the D switch drivers 216. These two signals are called DSYNC* and ESYNC*. FIG. 3 also illustrates these two signals. Except for the address "don't care" in the initilization and preset portion of the sequence of pin memory addresses and on the last occurrence of the "F" address in the test cycle, the signal DSYNC* is the same as the clock signal MCKL*. On the other hand, the signal ESYNC* has the characteristic that it may occur on the first occurrence of each of the pin memory addresses or may occur on the occurrence of any one or all of the memory addresses.

Referring still to FIG. 5, in which is shown the circuit diagram for the D and E sync generator 204, the signal DSYNC* is derived from MCKL but is enabled only during a test cycle through AND gate 528 and inverter 530 by the signal DCLR*. Also, during the initialization and preset time of the test cycle when the third pin memory address is generated ("don't care" address), all input signals to priority encoders 508 and 510 are at a logic one. This causes the PRESET DISABLE output from priority encoder 510 to be at a logic 0. This level causes DSYNC* to remain high for that "don't care" pin memory address in the initialization and preset portion. Because changes in the output of the digital test signal from the D switch driver 216 are clocked when the signal DSYNC* goes false in the middle of a pin memory address, for the "don't care" pin memory address of the initialization and preset time, no transition in DSYNC* occurs; thus the label "don't care".

Still referring to FIG. 5, the signal ESYNC* may be selected to occur on only the first occurrence of each of the pin memory addresses, or it can be selected to occur on every occurrence of any address or on every address. This flexibility is achieved as follows: A four-bit data word is inputted to the D sync and E sync generator 204 from the CPU 100 and on the assertion of CMD13*, is strobed into a sixteen-bit latch formed from addressable latches 532 and 534. Each of the sixteen latches corresponds to one address in the possible sixteen pin memory addresses. The output from latches 532 and 534 are inputted to multiplexers 536 and 538, respectively. Also inputted to multiplexers 536 and 538 are the Gray Code pin memory addresses GMA0 through GMA3. The multiplexed output from multiplexers 536 and 538 are bussed together to form an enabling signal to one input of AND gate 540. The latches 532 and 534 can be programmed to contain all zero's or all one's or any of the combinations of one's and zero's that are possible. In operation, during the test cycle as the Gray Code pin memory addresses are generated, the contents of the latch from latches 532 and 534 that corresponds to the generated address is multiplexed to AND gate 540. If a one was stored in the latch, AND gate 540 is enabled to pass one cycle of MCKL to OR gate 542 whose output, acting through inventor 544, generates the signal ESYNC*. If a zero was stored in the latch, AND gate 540 is disabled and no ESYNC* signal will be generated. Thus, the signal ESYNC* can be programmed to occur on any address by storing a one in the appropriate latch in latches 532 and 534.

It is also possible to have ESYNC* occur only on the first occurrence of the pin memory address during the test cycle. This is accomplished by a four-bit binary counter 522 in association with a four-bit magnitude comparator 520. At the start of the test cycle, counter 522 is cleared to a count of 0. The binary count from counter 522 is compared to the binary code on the Gray Code pin memory address lines GMA0 through GMA3, by four-bit magnitude comparator 520. When there is a count match, AND gate 524 is enabled by the "A=B" output of comparator 520, to permit one cycle of MCKL to be applied as the other input to OR gate 542 and thus to generate the signal ESYNC*. The output from AND gate 524 is inverted by inverter 526 and provides a clock signal to counter 522. This increments counter 522 to the next address. The first occurrence of this address by the pin memory address generator 202 will enable another ESYNC* to be generated. Once counter 522 has been incremented sixteen times and reaches a count of 0 there will never be another match in magnitude comparator 520, because the Gray Code memory address is an all 0's or "0" address only during the initialization and present time, which occurs only at the start of the test cycle.

Figure 6:
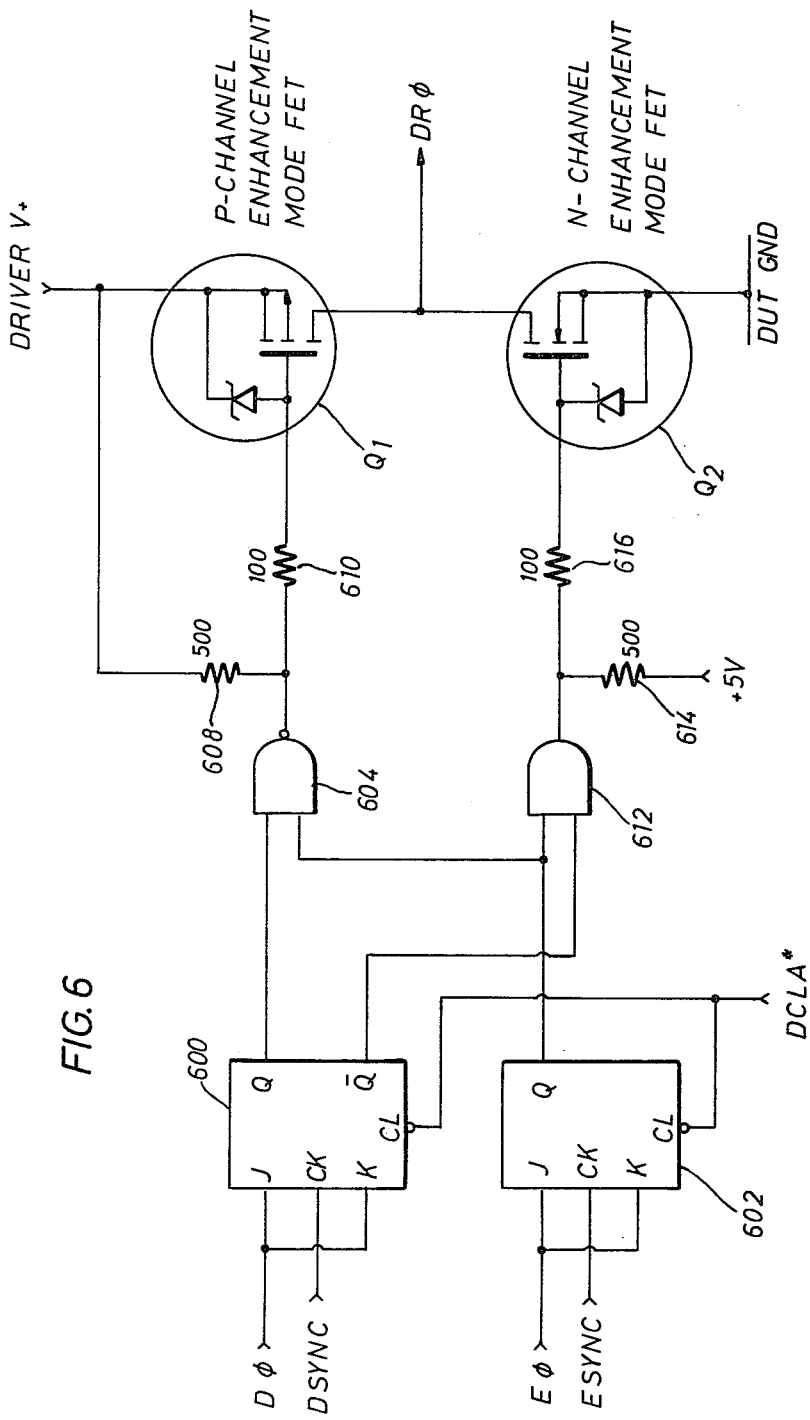
FIG. 6 is the circuit diagram of a test signal D switch driver.

The signals DSYNC* and ESYNC* are inputted to test signal drivers 118 to clock each DR switch driver 216 to generate the digital test signal on the output of the driver (see FIG. 2(b)). Shown in FIG. 6 is a circuit diagram of a typical DR switch driver 216. Since all of the DR switch drivers 216 of test signal drivers 118 are identical in operation, only a discussion of one will be given. The data (D0) and enable (E0) lines from memory 214 for test pin 1 of the bed of nails 122 are inputted to D switch driver 216 of FIG. 6 to provide the J and K inputs for flip-flops 600 and 602, respectively. Flip-flop 600 is clocked by DSYNC which is the buffered inverse of DSYNC* (see FIG. 2(b)), while flip-flop 602 is clocked by ESYNC, also buffered. The Q and Q* outputs from flip-flop 600 provide inverse digital signals that control the conduction state of a complimentary pair of field effect transistors $Q_1$ and $Q_2$. These two transistors switch the output signal DR0 between the power supply and ground potential for the DUT being tested to provide the voltage swing for the digital test signal. Ground potential for the DUT is the same as for the tester.

Before the Q and Q* outputs of flip-flop 600 are allowed to control the transistors $Q_1$ and $Q_2$, the enable flip-flop 602 must be clocked to a logic 1 by ESYNC. Open-collector NAND gate 604 combines the Q output of flip-flop 602 with the Q output of flip-flop 600 to provide the control signal for transistor $Q_1$. Open-collector AND gate 612 combines the Q output of flip-flop 602 and the Q* output of flip-flop 600 to provide the control signal for transistor $Q_2$.

Driver output DR0 has three allowable states: First, when neither transistor Q1 nor transistor Q2 is conducting, the driver DR0 is said to be disabled. When the driver is disabled, it does not stimulate the device under test. This disabled state is obtained whenever enable flip-flop 602 is cleared to a logic zero. The output of AND gate 612 is low, turning off N-channel-transistor Q2. The output of open-collector NAND gate 604 is pulled up to "Driver V+" potential by resistor 608, turning off P-channel transistor Q1. In the disabled state, the output of the driver will be an open circuit. Therefore, it is possible to have both the D and the F switch for this test pin selected. During the test cycle, when the driver is disabled, the same node into which a digital test signal was or could have been inputted, a response signal could also be monitored. For some logic devices, that is the manner in which they function. For example, some memory devices require that an address be inputted on the same line that the contents of the memory specified by that address is outputted on. Because of the disable node of operation of the driver 216, the D switches is not required in the set of selectable switches associated with each test pin in the bed of nails 122. Second, when transistor Q1 is conducting, the driver output will be high. This state is obtained whichever enable flip-flop 602 and data flip-flop 600 are both set. The output of open-collector NAND gate 604 is low, stimulating the P-channel transistor Q1. Third, when transistor Q2 is conducting, the driver output will be low. This occurs when enable flip-flop 602 is set and data flip-flop 600 is cleared. The output of AND gate 612 is high, stimulating the N-channel transistor Q2. Note that for either transistor to conduct, the enable flip-flop 602 must be set, and that transistors Q1 and Q2 may not conduct simultaneously. In addition, the transistors are able to pass 150 milliamperes, enough to drive a logic node "in-circuit".

Referring now to FIG. 7(a), which illustrates a block diagram of test controller 104 and functional tester 106, the command decoder 710 of test controller 104 is shown connected to one of the CPU 100 I/O 102 ports. The function of command decoder 710 is to accept an 8-bit digital code from CPU 100 and decode it to generate one of thirty-two system commands CMD0* through CMD31*. Command decoder 710 also generates the miscellaneous system commands, such as board address override BAOR*, functional test COUNT*, functional test HIGH*, and EXT CLOCK SELECT*. Shown in Table 1 is a list of the system commands along with its functional name. System commands CMD5* through CMD7* are used to strobe date from the CPU 100 into latches (not shown) that function to generate other signals used by the tester 101 to perform various functions. The signals generated by these three system commands, CMD5* through CMD7*, are also shown in Table 1. In particular, the miscellaneous system commands mentioned above are generated by CMD7* (mode latch #2) in association with the data on the data lines illustrated in Table 1. The system commands that are generated by command decoder 710 are used to start and stop various functions within the digital tester 101.

TABLE I

| COMMAND | SKIP CONTROLLER COMMANDS | |
|---|---|---|
| CMD0* | Master Reset | |
| CMD1* | Trigger An Execution Cycle | |
| CMD2* | Reed Set | |
| CMD3* | Reed Clear | |
| CMD4* | Reed Group Clear (RCLR*) | |
| CMD5* | Control Reed Latch | Data Line Control Reeds |
| | | 0 Response Line Connect |
| | | 1 Connect E Pole Reed |
| | | 2 Ground E |
| | | 3 Stimuli F |
| | | 4 Ground G |
| | | 5 not assigned |
| CMD6* | Mode Latch #1 | Data Line Mode Latch #1 |
| | | 0 DUT − Reed |
| | | 1 DUT + Reed |
| | | 2 DUT + 5V Supply Relay |
| | | 3 DUT + RV Supply Relay |
| | | 4 not assigned |
| | | 5 not assigned |
| CMD7* | Mode Latch #2 | Data Line Mode Latch #2 |
| | | 0 Count*/High* Reg Select |
| | | 1 BAOR* |
| | | 2 EXT CLOCK SELECT* |
| | | 3 not assigned |
| | | 4 not assigned |
| | | 5 not assigned |
| CMD8* | Shift Result Registers | |
| CMD9* | Program Data Transfer | |
| CMD10* | MG & RA & RG Latch | |
| CMD11* | Threshold Voltage Latch | |
| CMD12* | Clock Division Latch | |
| CMD13* | ESYNC Set | |
| CMD14* | MEM Write | |
| CMD15* | Clear ESYNC Memory | |
| CMD16* | Not Assigned | |
| CMD17* | Not Assigned | |
| CMD18* | PICA Busy Set | |
| CMD19* | PICA Busy Reset | |
| CMD20* | Interupt Enable | |
| CMD21* | Interupt Disable | |
| CMD22* | X Relay Strobe ($\overline{\text{STROBE}}$) | |
| CMD23* | X Relay Master Clear (MCLR) | |
| CMD24* | Not Assigned | |
| CMD25* | Not Assigned | |
| CMD26* | Not Assigned | |
| CMD27* | Not Assigned | |
| CMD28* | Not Assigned | |
| CMD29* | Not Assigned | |
| CMD30* | Not Assigned | |
| CMD31* | Not Assigned | |

In order to accommodate the various logic voltage levels used by different DUT's, test controller 104, in response to input data from CPU 100, generates a negative threshold voltage, (−) THRESHOLD, of a value somewhere between the logic low and logic high for that family of integrated circuits. This threshold voltage is summed with signals from the DUT to generate a voltage that is applied as an input to a comparator. When the DUT signal is equal to a positive threshold voltage, the summed voltage will be zero. A more detailed discussion of the summing circuits will be given below in the discussion of the response line interface 720. The signal (−) THRESHOLD is generated when system command CMD18* strobes an 8-bit digital word from the CPU 100 into threshold voltage latch 700. The output of latch 700 is inputted to digital-to-analog converter 702, which generates a negative voltage specified by the binary contents of the threshold latch 700.

The system clock which is generated by and used in the digital tester 101 circuits as the master clock is generated by master clock generator 706. The system clocks MCKL and MCKL* are outputted by master clock generator 706 by dividing down an 8 MHZ oscillator clock signal from internal oscillator 708 in a divide-by-N counter. The value of N is specified by the contents of divide-by-N counter latch 704. System command CMD12* strobes an 8-bit data word (N) from CPU 100 into latch 704 to program the divide-by-N counter. Oscillator 708 also provides a 2 MHZ oscillator clock signal for use by the pin memory data transfer controller 200 (see FIG. 4). When an external clock other than the 8 MHZ internal clock is to be used, EXT CLOCK SELECT* is asserted to control master clock generator 706 to select the EXT CLOCK input as the source of the clock signal to the divide-by-N counter. Interface circuit between the tester 101 and DUT signal levels of the same design that are discussed below for the response line interface 720 are used to interface the EXT CLOCK signal into the master clock generator 706.

Still referring to FIG. 7(a), start test cycle generator 714, in association with the listen enable generator 712, controls the starting and stopping of the test cycle in which the digital test signals are generated and the response line signal monitored by the functional tester 106. Responding to start test cycle generator 714, listen enable generator 712 also generates a listen enable signal LISTEN* that is inputted to the functional tester 106 to allow the functional tester 106 to examine the response line signal 128 when the listen enable signal is true.

Figure 8:
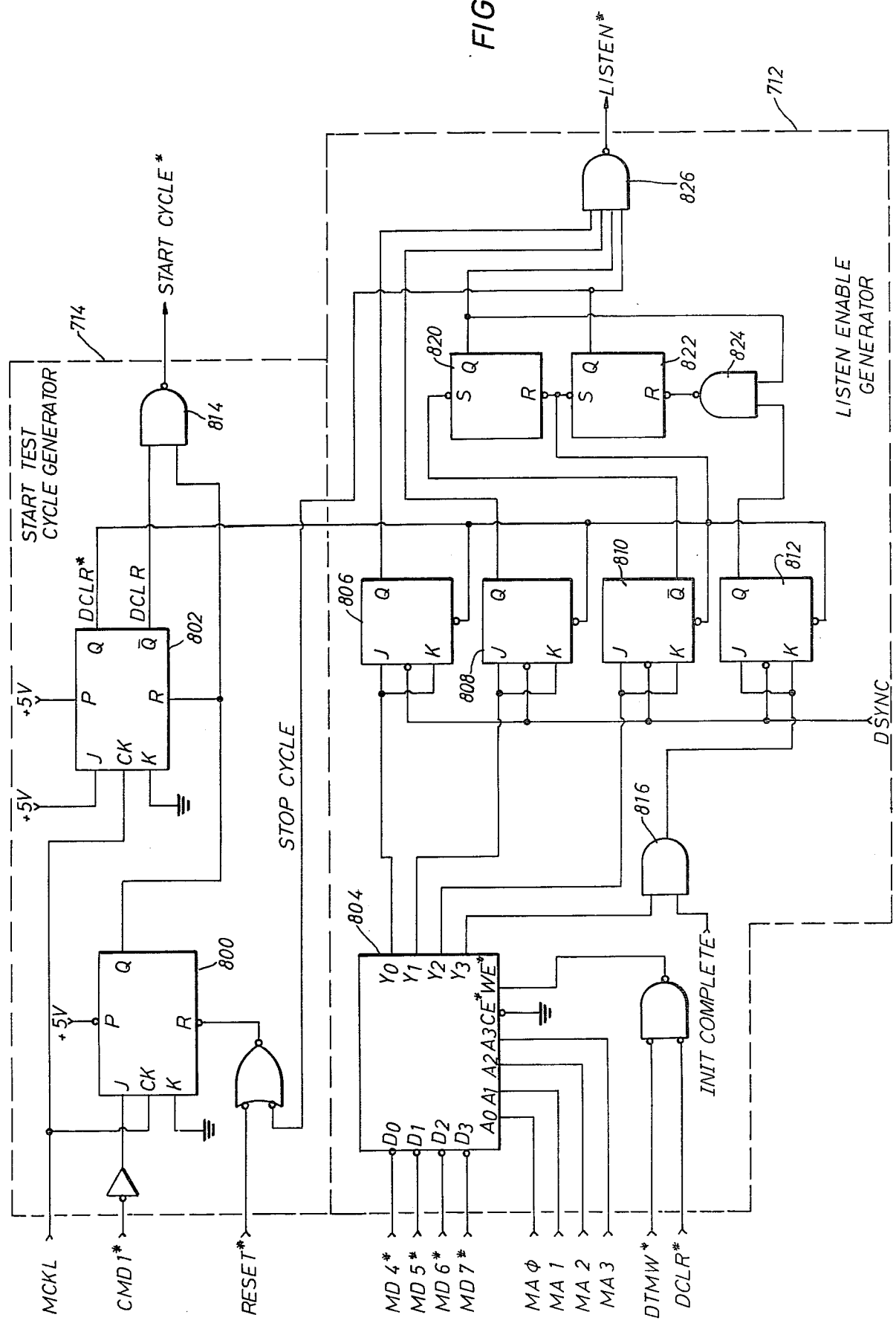
FIG. 8 is a circuit diagram of the listen enable and start-of-test cycle generators.

FIG. 8 illustrates the circuit diagram for start test cycle generator 714 and the listen enable generator 712. Start test cycle generator 714 generates the signal START CYCLE* to indicate the beginning of a test cycle. Upon the issuance of the system command CMD1*, flip-flop 800 is clocked by MCKL a logic 1 thus enabling one input of NAND gate 814. Because the Q output of flip-flop 800 was at a logic 0 prior to the issuance of CMD1*, the Q* output of flip-flop 802 is at a logic 1 when CMD1* is asserted. This signal is inputted to NAND gate 814 as well as the Q output of flip-flop 800 so that on the occurence of a logic 1 on the Q output of flip-flop 800, the output of NAND gate 814 asserts START CYCLE*. One MCKL cycle later, flip-flop 802 is clocked to a logic zero causing the output of NAND gate 814 to switch back to a logic one. Thus, START CYCLE* is asserted for one clock cycle of MCKL. Following the assertion of START CYCLE*, DCLR* goes true to indicate that a test cycle is occurring. The Q output of flip-flop 802 is DCLR* which assumes a logic 1 state during a test cycle. A test cycle will continue as long as flip-flop 802 is at a logic one. The three signals START CYCLE*, DCLR* and its inverse DCLR are used throughout the digital tester 101 to enable and disable the various functions that are performed.

Figure 10:
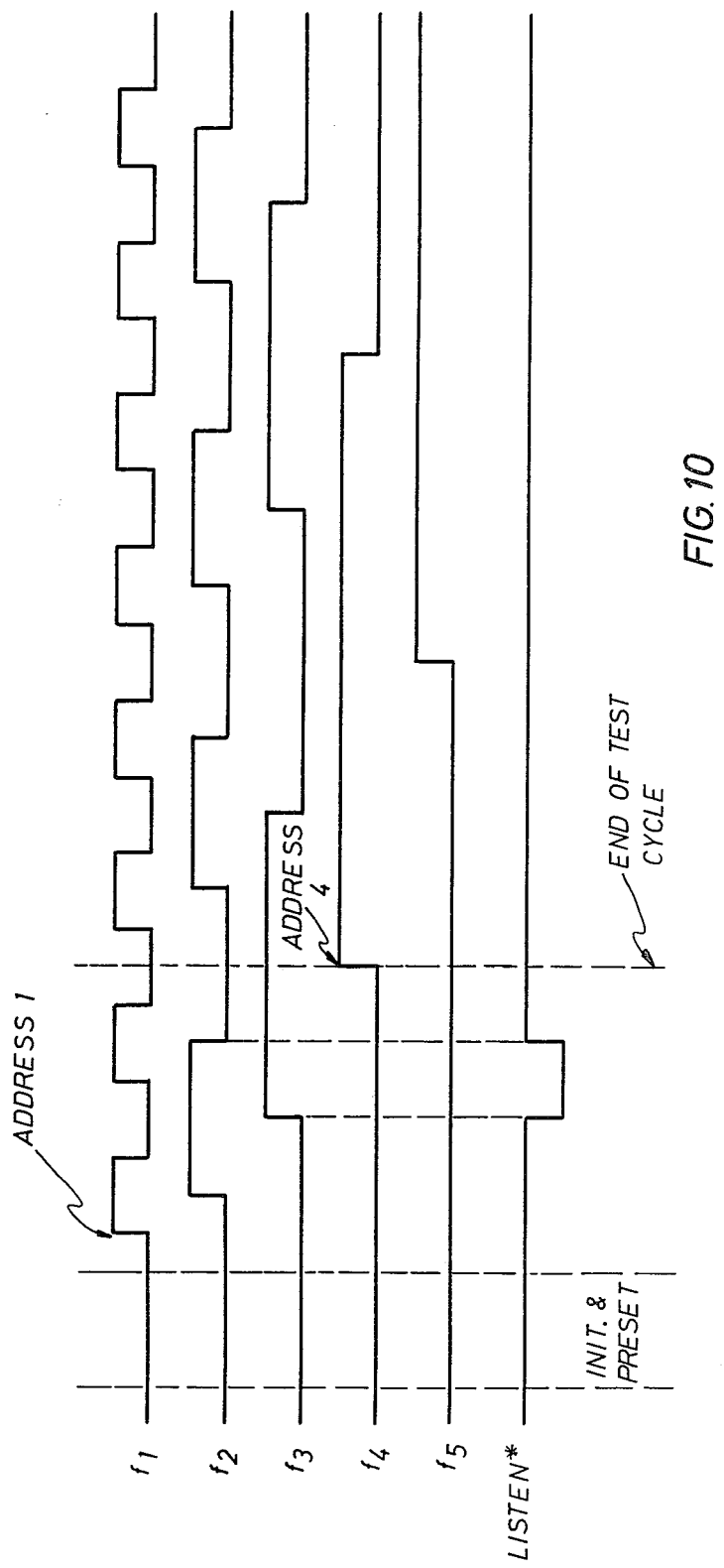
FIG. 10 is a timing diagram which illustrates the generation of a listen enable signal.

The listen enable generator 712, as shown in FIG. 8, determines the length of the test cycle and generates a listen enable signal LISTEN* that enables the functional tester 106 to monitor and test the response signal 128 during a test cycle. LISTEN* will be enabled from the first occurrence of a selected pin memory address, although it may not actually be asserted at that time. Further conditions must also occur before LISTEN* will be asserted. To better understand the function of listen enable generator 712, refer to FIG. 10, which illustrates the timing diagram for five possible digital test signals that are members of the set of digital test signals. Each transition in the illustrated waveforms of FIG. 10 occurs when the pin memory address for that test signal occurs (see FIG. 3). Thus, a transition in $f_3$ occurs when the address "3" occurs. The listen enable generator 712 generates LISTEN* during the time that two preselected test signals are at a logic one and that a first preselected pin memory address has occurred and that a second preselected pin memory address has not. In other words, LISTEN* can occur between the first occurrence of two pin memory addresses but will not be asserted until two other test signals are simultaneously in a logic one state. For example, FIG. 10 illustrates the generation of LISTEN* that is enabled between address 1 and address 4 with the added conditions that $f_2$ and $f_3$ are at a logic one.

The signal LISTEN* is generated as follows: Listen enable generator 712, as shown in FIG. 8, has a 16 ×4 bit memory 804 which is similar to the memories 214 in pin memory 112 (see FIG. 2(b)). Inputted to memory 804 are the pin memory address signals MA0 through MA3. These address signals, as previously discussed, are generated both during the test cycle and also during the initialization of the digital tester 101. Also inputted to memory 804 are write enable and data input lines from CPU 100. During the initialization of the digital tester 101, data on the data lines MD4* through MD7* are strobed into memory 804 by asserting bit 7 of port #1 while the pin memories 112 are being programmed. During the test cycle, the contents of memory 804 are outputted to flip-flops 806, 808, 810 and 812 under control of the Gray Code pinmemory address that are used by memories 214 to generate the digital test signals for the test pins. The J and F inputs to flip-flops 806, 808 and 810 are connected to one of the four output bits from memory 804. The J and K inputs to flip-flop 812 is connected to the output from AND gate 816 that has as one of its two inputs, the last of the four bits from memory 804. This bit is enabled through AND gate 816 by the signal INIT COMPLETE (see FIG. 5) from the test signal address generator 202. INIT COMPLETE goes true at the end of the initialization and preset portion of the test cycle. The signal INIT COMPLETE is used to prevent the addresses which occur during the initialization and preset portion of the test cycle from terminating the test cycle should those addresses be used in the generation of LISTEN*.

The Q ouputs from flip-flop 806 and 808 are inputted to four input AND gate 826 whose output is the signal LISTEN*. The function of flip-flop 806 is to enable one input to AND gate 826 when the first occurence of a pin memory address occurs thereby signifying that one of the possible Gray Code signals has gone to a logic one. The function of flip-flop 808 is the same as 806. The Q output from set-reset flip-flops 820 and 822 are inputted as the two remaining inputs to AND gate 826. Flip-flop 820 is set when flip-flop 810 is clocked to a logic one and flip-flop 822 is reset (flip-flop 822 was set at the start of the test cycle by DCLR*) by the Q output of flip-flop 812 through NAND gate 824 which was enabled by the Q output of flip-flop 820 after flip-flop 820 has been set. In operation, the memory 804 is programmed with logic one's in the appropriate memory locations so that on the occurrence of the pin memory address, during a test cycle, that are selected to start and stop the generation of the signal LISTEN* during a logic high of any two Gray Code signals, a logic one will be outputted to flip-flops 806, 808, 810 and 812. When flip-flops 806, 808 and 810 have been set, LISTEN* will be asserted. When flip-flop 812 is set, LISTEN* will go false terminating the enable signal to the functional tester 106 and the test cycle will be terminated. The Q output of flip-flop 822, which is reset when flip-flop 812 is set, is the signal STOP CYCLE which is inputted to the start test cycle generator 714 to terminate the test cycle.

Now turning to FIG. 7(a), functional tester 106 is shown, composed of response interface 720 responding to the response signal input 128 and the (−) THRESHOLD voltage to generate the response signal RDATA. Also associated with the output of response line interface 720 is an analog-to-digital converter 722, for converting the analog response line signal 128 to an 8 bit digital reresentation. The output of analog-to-digital converter 722 is inputted to CPU 100 through one of the input ports of I/O ports 102 when the analog voltage of the response line is desired. Functional tester 106, in addition to the analog-to-digital converter test, performs three other tests. First, the CRC function tester 724 monitors a bit stream of 1's and 0's on RDATA, to generate a compact digital code representing the length and character of the bit stream. Second and third the COUNT and HIGH function tester 726 counts the number of transistions that occurred in RDATA during the test cycle for a COUNT test, while the HIGH test counts the number of system clocks MCKL that occur during the logic high periods of the response signal RDATA.

Figure 9:
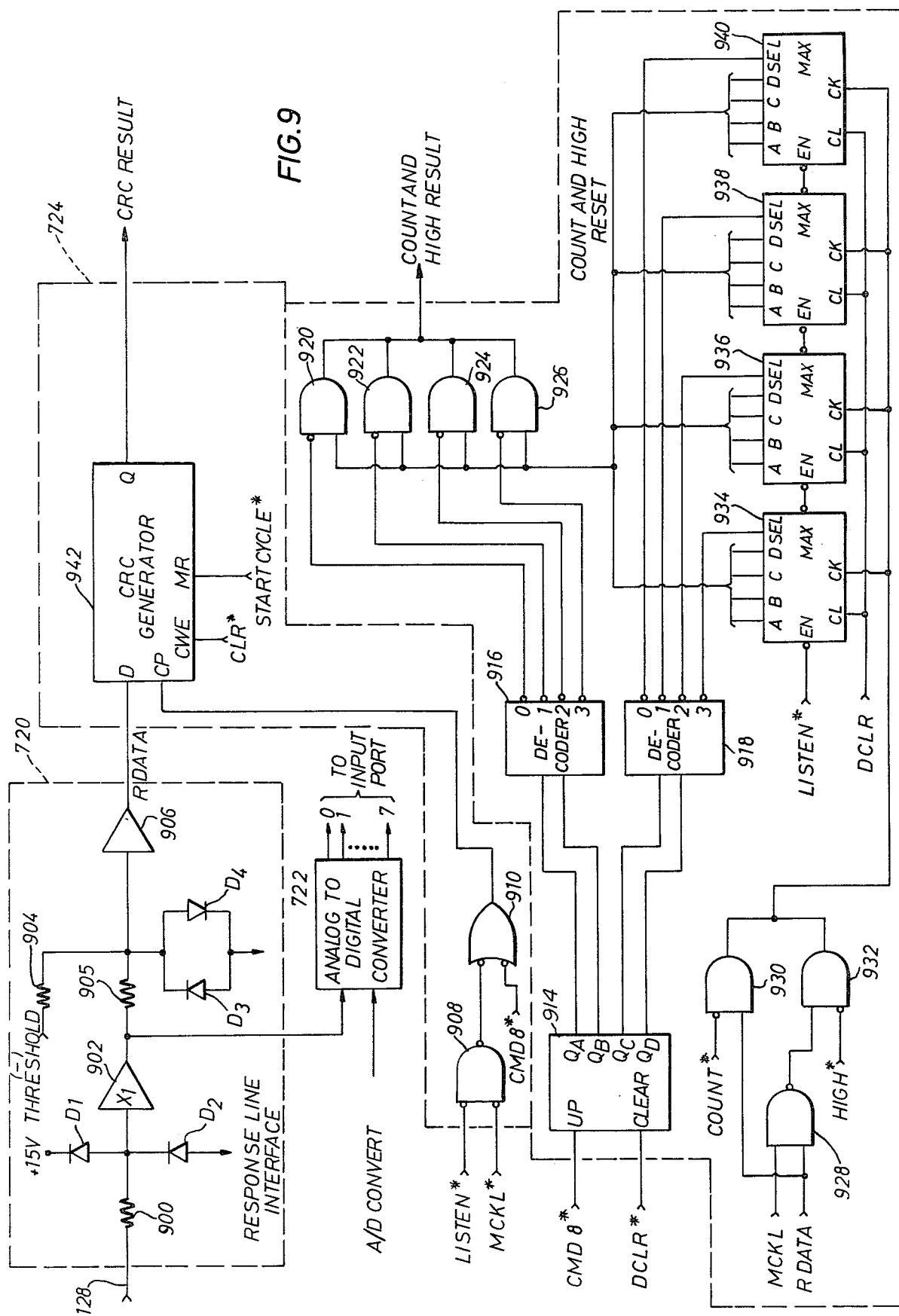
FIG. 9 is a circuit diagram of the functional tester.

Referring now to FIG. 9, which illustrates the circuit diagram of the functional tester 106, the response line signal 128 is shown inputted to buffer amplifier 902 through series resistor 900. The input voltage to buffer 902 is diode limited between +15 volts and analog ground by diodes D$_1$ and D$_2$. The output of buffer amplifier 902 is inputtedto resistor 905 and to the analog-to-digital converter 722. The output of buffer amplifier 902 is summed with the (−) THRESHOLD voltage generated by the digital-to-analog converter 702 (see FIG. 7(a)), to form the input voltage to comparator 906. Resistors 904 and 905, which are both connected to the input of comparator 906, comprise the summing network which adds the (−) THRESHOLD voltage to the output of buffer 902. Diodes D$_3$ and D$_4$ are connected, in parallel but opposite directions, from the input of comparator 906 to analog ground. With this configuration, D4 limits positive voltages while D3 limits negative voltages. In this way, the input voltage to comparator 906 is limited to voltages of a plus or minus one diode drop about the mid-point of the expected response signal swing of the response line 128. The output of comparator 906 is the signal RDATA, which is inputted to the CRC 724 and COUNT and HIGH 726 function testers.

As shown in FIG. 9, CRC function tester 724 uses a CRC generator/checker, such as that manufactured by Fairchild Semiconductor model 9401, described in their 1976 catalog entitled "micro-logic", which catalog is incorporated herein for all purposes. This device generates a cyclic redundancy check code on the signal RDATA. The system clock MCKL, when not inhibited by LISTEN*, clocks CRC generator 724 through NAND gates 908 and NOR gate 910. At the completion of the test cycle, the contents of the CRC generator 724 are clocked into CPU 100 with the assertion of the command CMD8*. Each assertion of CMD8* clocks 1 bit of the cyclic redundancy check code into the CPU 100.

As discussed above, the COUNT and HIGH function tester 726 either counts the number of transitionsin RDATA during the test cycle or counts the number of system clocks during the test cycle when RDATA was true. When the functional test COUNT is true, a cascaded connection of BCD counters 934, 936, 938 and 940 count the number of positive transitions of the response signal RDATA that occurred during the test cycle. The signal COUNT* is ANDED with the signal RDATA through AND gate 930 to generate the clock signal for the BCD counters. When the inhibit signal LISTEN* goes false, the BCD counters are allowed to count. In a similar manner, for the functional test HIGH, NAND gate 932 generates a clock signal to the BCD counters from the system clock MCKL when the signal RDATA is true.

At the completion of both the COUNT and HIGH functional test, the contents of the BCD counters are multiplexed onto a single line and inputted to CPU 100. This multiplexing is accomplished by binary counter 914 and the one-of-four decoders 916 and 918. The outputs from each of the BCD counters are selectively enabled by a select line for each counter. The common outputs from each of the counters may be bussed together, so that only the output of the BCD counter selected will be presented to the bus. System command CMD8* is counted by counter 914, which outputs a 4 bit digital code in which the two lower order bits are inputted to one-of-four decoder 916, to generate four enable signals. The two upper bits are inputted to one-of-four encoder 918 to generate four select signals. The enable signals are inputted to multiplexer NAND gates 920, 922, 924 and 926. The bussed output of each of the BCD counters is inputted as the other input to each of these multiplexer NAND gates. The outputs of the multiplexer NAND 920, 922, 924 and 926 are connected together to form the single output signal COUNT AND HIGH RESULT, which is inputted to the CPU 100 via an input port of I/O ports 102. These multiplexing circuits function so that each assertion CMD8* causes each succeeding output from the four cascaded BCD counters 934, 936, 938 and 940 to be sequentially multiplexed onto the COUNT AND HIGH RESULT signal line.

When the results from the functional tester 106 have been inputted to the CPU 100, routines will be executed to compare the measured result to a result that would be expected from a properly functioning DUT. Based on this comparison, a determination is made as to how the DUT performed.

In describing the invention, reference has been made to a preferred embodiment. However, those skilled in the art and familiar with the disclosure of the invention may recognize additions, deletions, substitutions or other modifications which would fall within the purview of the invention as defined in the appended claims.

What is claimed is:

1. Apparatus for the in-circuit testing of the electrical properties of components of a circuit, comprising:
   (a) a central processing unit for controlling the tests to be performed and for interpreting the results of said tests;
   (b) electrical test pins, contactable with electrical nodes in said circuit;

(c) sets of selectable switches, one set associated with each of said test pins, for connecting each of said test pins to at least one of a plurality of signal lines associated with each said pin, said signal lines including a response signal line;

(d) a plurality of digital test-signal generators, each of said generators being associated with one of said test pins, for generating at least one digital test signal from a set of test signals, the output line from each of said generators comprising one of the plurality of signal lines for the test pin associated with said generator;

(e) switch-selecting means responsive to the central processor, for selecting at least one of said selectable switches, to connect selected ones of said test pins to their associated plurality of signal lines, thereby to connect one of said plurality of digital test-signal generators to one of the nodes of the circuit, and to connect a node of the circuit to the response signal line;

(f) a test controller responsive to the central processor, for generating a test cycle wherein said digital test-signal generators supply test signals to said circuit, thereby to cause the circuit to produce a response signal on said response signal line; and (g) a functional tester responsive to the central processor, for testing the signal on said response signal line, to determine electrical properties of said circuit.

2. The apparatus in accordance with claim 1 wherein said electrical test pins comprise a bed of nails fixture.

3. The apparatus of claim 1, wherein the plurality of selectable switches in each of said sets of selectable switches includes four selectable switches.

4. The apparatus of claim 1, wherein said selectable switches are reed switches.

5. The apparatus of claim 1, wherein said set of test signals includes a set of Gray Code test signals.

6. The apparatus of claim 5 wherein, the set of Gray Code test signals comprises fourteen digital test signals.

7. The apparatus of claim 1, wherein each of said digital test-signal generators includes:

(a) a memory address generator for generating a sequence of memory addresses during said test cycle;

(b) a first memory responsive to said address generator, for outputting a logic signal to select a digital test signal, said memory having a specified storage location for each digital test signal, said logic signal enabling a transition in said selected test signal;

(c) a second memory responsive to said address generator, for outputting a logic signal to enable and to disable the generation of said selected test signal;

(d) a synchronization signal generator responsive to said memory address generator for generating synchronization signals; and (e) a driver responsive to the output from said first and second memories, and to said synchronization signals, for generating the selected digital test signal and for applying said selected digital test signal to an electrical node of said circuit.

8. The apparatus of claim 7, wherein said sequence of memory addresses comprises the ordered sequential addresses of each of the addressable storage locations of said first memory and said second memory, each address in said sequence enabling a transition in said digital test signal specified by that address.

9. The apparatus of claim 8, wherein said first memory further comprises a memory location for storing an initialization bit, and another memory location for storing a preset bit, said initialization and preset bits specifying one of a plurality of possible beginning sequences for each of said digital test signals.

10. The apparatus of claim 7, wherein said synchronization signal generator includes:

(a) means for generating a first synchronization signal having a transition for each address of said address generator; and (b) means for generating a second synchronization signal having a transition,
  (i) on the first occurrence of each address in said sequence of memory addresses, or
  (ii) on each occurrence of any or all addresses in said sequence of memory addresses.

11. The apparatus of claim 7, wherein said digital test signal generator further comprises means responsive to said processor for addressing and storing in said first and second memories digital-test-signal-generating data prior to the generation of said test cycle.

12. The apparatus of claim 1, wherein said test controller includes:

(a) an internal oscillator;

(b) a threshold voltage generator responsive to said processor for generating a negative offset voltage to offset the voltages produced by externally generated signals inputted to the testing apparatus, the external signals including an external clock signal;

(c) a system clock generator responsive to the external clock signal, said processor, said oscillator and said threshold voltage generator, for generating a system clock, said system clock being derived from said internal oscillator or from the external clock;

(d) a command decoder responsive to said processor, for generating system commands to control the functions of said tester;

(e) a listen enable generator responsive to said processor and said digital test-signal generators, for controlling the length of said test cycle, and for generating a listen enable signal to enable said functional tester to perform functional tests on said response signal during the generation of said listen enable signal; and (f) a start test cycle generator responsive to said clock, said listen enable generator, and said command decoder, for starting and stopping said test cycle.

13. The apparatus of claim 12, wherein said system clock generator includes a divide-by-N counter.

14. The device of claim 12, wherein said threshold voltage generator is a digital-to-analog converter.

15. The apparatus of claim 1, wherein said functional tester includes a cyclic redundancy check function tester for generating a digital code representative of the length and character of the serial digital data stream of said response signal, said code representing the signature of said response signal.

16. A testing apparatus adapted for use with a computer for the in-circuit testing of a circuit having electrical nodes, comprising:

(a) a node-connecting means associated with each of a selected ones of said nodes and responsive to the computer, each selected node having associated therewith signal lines including a response signal line, for connecting each of the selected nodes to its associated signal lines, one of said selected nodes being connected to the response signal line;

(b) a digital test-signal generator associated with each said node-connecting means, for generating at least one digital test signal from a set of digital test signals, the output line from each said generator comprising one of the associated signal lines for the node associated with said generator;

(c) a controller responsive to the computer, for generating a test cycle in which selected ones of said test signals are applied through said associated node-connecting means to selected ones of said selected nodes, said circuit generating a signal on said response signal line in response to said applied test signals; and (d) a functional tester connected to the response signal line and responsive to the computer, for performing functional tests on said response signal to determine electrical properties of said circuit.

17. The apparatus of claim 16, wherein each said node-connecting means includes:

(a) a test pin contactable with an associated selected electrical node of said circuit; and (b) a set of selectable switches connected to each of said test pins, for connecting each test pin to one of its associated signal lines; and (c) switch selecting means responsive to the computer, for selecting at least one of said selectable switches, (i) to connect one of said plurality of digital test-signal generators to one of the nodes of the circuit, and (ii) to connect a node of the circuit to the response signal line.

18. The apparatus of claim 17, wherein each said set of selectable switches includes a switch for connecting the output from one of said associated digital test-signal generators to its associated test pin.

19. The apparatus in accordance with claim 16, wherein said functional tester includes:

(a) an analog-to-digital converter;

(b) a counter for counting (i) the number of cycles in a clock signal that occurred when said response test signal is at a logic high state, or (ii) the number of pulses in said response test signal that occur in said test cycle; and (c) a cyclic redundancy check generator, for generating a digital code for the serial bit stream of said response test signal, said code representing the signature of said signal.

20. The apparatus of claim 16, wherein said controller includes:

(a) a system clock generator responsive to said computer for generating a master system clock for said tester;

(b) a command decoder responsive to said computer for generating control signals to control the functions of said tester;

(c) a listen enable generator responsive to said computer and said digital test-signal generators, for generating a listen enable signal, to enable said functional tester to perform functional tests on said response signal during the generation of said listen enable signal, and for controlling the length of said test cycle; and (d) a start test cycle generator responsive to said system clock, said command decoder and said listen enable generator, for starting the stoping said test cycle.

21. Apparatus adapted for use with a central processor for the in-circuit testing of the electrical properties of a circuit under test, said apparatus having a response signal line for monitoring the response signal from the circuit under test, the apparatus comprising:

(a) electrical test pins, contactable with electrical nodes in said circuit;

(b) a selectable switch associated with each test pin, for selectively connecting the associated said test pin to the response signal line;

(c) a plurality of digital test-signal generators, one associated with each of said test pins, for generating at least one digital test signal from a set of test signals, the output line from each said generator adapted for connection to its associated test pin;

(d) switch-selecting means responsive to the central processor, for selecting one said selectable switch to connect a node of said circuit to said response signal line; and (e) a test controller responsive to the central processor, for generating a test cycle wherein selected ones of said digital test-signal generators supply test signals to said circuit, thereby to cause the circuit under test to produce a response signal on said response signal line.

22. The apparatus in accordance with claim 21 further comprising a functional tester connected to the response signal line and responsive to the central processor, for testing the signal on the response signal line, to determine electrical properties of the circuit.

23. The apparatus in accordance with claim 21 wherein said electrical test pins comprise a bed of nails fixture.

24. The apparatus of claim 21, wherein said selectable switch is a reed switch.

25. The apparatus of claim 21, wherein the set of test signals includes a set of Gray Code test signals.

26. The apparatus of claim 25, wherein the set of Gray Code test signals comprises fourteen digital test signals.

27. The apparatus of claim 21, wherein each of said digital test-signal generators includes:

(a) a memory address generator for generating a sequence of memory addresses during said test cycle;

(b) a first memory responsive to said address generator, for outputting a logic signal to select a digital test signal, said memory having a specified storage location for each digital test signal, said logic signal enabling a transition in said selected test signal;

(c) a second memory responsive to said address generator, for outputting a logic signal to enable and to disable the generation of said selected test signal;

(d) a synchronization signal generator responsive to said memory address generator for generating synchronization signals; and (e) a driver responsive to the output from said first and second memories, and to said synchronization signals, for generating the selected digital test signal and for applying said selected digital test signal to an electrical node of said circuit.

28. The apparatus of claim 27, wherein said sequence of memory addresses comprises the ordered sequential addresses of each of the addressable storage locations of said first memory and said second memory, each address in said sequence enabling a transition in said digital test signal specified by that address.

29. The apparatus of claim 28, wherein said first memory further comprises a memory location for storing an initialization bit, and another memory location for storing a preset bit, said initialization and preset bits specifying one of a plurality of possible beginning sequence for each of said digital test signals.

30. The apparatus of claim 27, wherein said synchronization signal generator includes:
   (a) means for generating a first synchronization signal having a transition for each address of said address generator; and
   (b) means for generating a second synchronization signal having a transition,
      (i) on the first occurrence of each address in said sequence of memory addresses, or
      (ii) on each occurrence of any or all addresses in said sequence of memory addresses.

31. The apparatus of claim 27, wherein said digital test signal generator futher comprises means responsive to said processor for addressing and storing in said first and second memories digital-test-signal-generating data prior to the generation of said test cycle.

32. The apparatus of claim 22, wherein said test controller includes:
   (a) an internal oscillator;
   (b) a threshold voltage generator responsive to said processor for generating a negative offset voltage to offset the voltages produced by externally generated signals inputted to the testing apparatus, said external signals including an external clock signal;
   (c) a system clock generator responsive to the external clock signal, said processor, said oscillator and said threshold voltage generator, for generating a system clock, said system clock being derived from said internal oscillator or from the external clock;
   (d) a command decoder responsive to said processor, for generating system commands to control the functions of said tester;
   (e) a listen enable generator responsive to said processor and said digital test-signal generator, for controlling the length of said test cycle, and for generating a listen enable signal to enable said functional tester to perform functional tests on said response signal during the generation of said listen enable signal; and
   (f) a start test cycle generator responsive to said listen enable generator, for starting and stopping said test cycle.

33. The apparatus of claim 32, wherein said system clock generator includes a divide-by-N counter.

34. The device of claim 32, wherein said threshold voltage generator is a digital-to-analog converter.

35. The apparatus in accordance with claim 22, wherein said functional tester includes:
   (a) an analog-to-digital converter;
   (b) a counter for counting
      (i) the number of cycles in a clock signal that occurred when said response signal is at a logic high state, or
      (ii) the number of pulses in said response signal that occur in said test cycle; and
   (c) a cyclic redundancy check generator, for generating a digital code from the serial bit stream of said response signal, said code representing the signature of said signal.

36. An apparatus for use with a central processing unit for in-circuit testing of the electrical properties of components of a circuit, said apparatus comprising:
   (a) electrical test pins, contactable with electrical nodes in said circuit;
   (b) sets of selectable switches, one set associated with each of said test pins, for connecting each of said test pins to at least one of a plurality of signal lines associated with each said pin, said signal lines including a response signal line;
   (c) a plurality of digital test-signal generators, each of said generators being associated with one of said test pins, for generating at least one digital test signal, the output line from each of said generators comprising one of the plurality of signal lines for the test pin associated with said generator;
   (d) switch selecting means responsive to the central processor, for selecting at least one of said selectable switches, to connect selected ones of said test pins to their associated plurality of signal lines, thereby
      (i) to connect one of said plurality of digital test-signal generators to one of the nodes of the circuit, and
      (ii) to connect a node of the circuit to the response signal line; and
   (e) a test controller responsive to the central processor, for generating a test cycle wherein said digital test-signal generators supply test signals to said circuit, thereby to produce a response signal on said response signal line.

37. The apparatus according to claim 36 further comprising a functional tester responsive to the central processor, for testing the signal on said response signal line, to determine electrical properties of the components of said circuit.

38. The apparatus in accordance with claim 36 wherein said electrical test pins comprise a bed of nails fixture.

39. The apparatus of claim 36, wherein each of said sets of selectable switches includes four selectable switches.

40. The apparatus of claim 36, wherein said selectable switches are reed switches.

41. The apparatus of claim 36, wherein said set of test signals includes a set of Gray Code test signals.

42. The apparatus of claim 41 wherein, the set of Gray Code test signals comprises fourteen digital test signals.

43. The apparatus of claim 36, wherein each of said digital test-signal generators includes:
   (a) a memory address generator for generating a sequence of memory addresses during said test cycle;
   (b) a first memory responsive to said address generator, for outputting a logic signal to select a digital test signal, said memory having a specified storage location for each digital test signal, said logic signal enabling a transition in said selected test signal;
   (c) a second memory responsive to said address generator, for outputting a logic signal to enable and to disable the generation of said selected test signal;
   (d) a synchronization signal generator responsive to said memory address generator for generating synchronization signals; and
   (e) a driver responsive to the output from said first and second memories, and to said synchronization signals, for generating the selected digital test signal and for applying said selected digital test signal to an electrical node of said circuit.

44. The apparatus of claim 43, wherein said sequence of memory addresses comprises the ordered sequential addresses of each of the addressable storage locations of said first memory and said second memory, each address in said sequence enabling a transition in said digital test signal specified by that address.

45. The apparatus of claim 44, wherein said first memory further comprises a memory location for storing an initialization bit, and another memory location for storing a preset bit, said initialization and preset bits specifying one of a plurality of possible beginning sequences for each of said digital test signals.

46. The apparatus of claim 43, wherein said synchronization signal generator includes:
 (a) means for generating a first synchronization signal having a transition for each address of said address generator; and
 (b) means for generating a second synchronization signal having a transition,
  (i) on the first occurrence of each address in said sequence of memory addresses, or
  (ii) on each occurrence of any or all addresses in said sequence of memory addresses.

47. The apparatus of claim 43, wherein said digital test signal generator further comprises means responsive to said processor for addressing and storing in said first and second memories digital-test-signal-generating data prior to the generation of said test cycle.

48. The apparatus of claim 37, wherein said test controller includes:
 (a) an internal oscillator;
 (b) a threshold voltage generator responsive to said processor for generating a negative offset voltage to offset the voltages produced by externally generated signals inputted to the testing apparatus;
 (c) a system clock generator responsive to an external clock signal, said processor, said oscillator and said threshold voltage generator, for generating a system clock, said system clock being derived from said internal oscillator or from the external clock;
 (d) a command decoder responsive to said processor, for generating system commands to control the functions of said tester;
 (e) a listen enable generator responsive to said processor and said digital test-signal generators, for controlling the length of said test cycle, and for generating a listen enable signal to enable said functional tester to perform functional tests on said response signal during the generator of said listen enable signal; and
 (f) a start test cycle generator responsive to said system clock, said listen enable generator, and said command decoder, for starting and stopping said test cycle.

49. The apparatus of claim 48, wherein said system clock generator includes a divide-by-N counter.

50. The device of claims 48, wherein said threshold voltage generator is a digital-to-analog converter.

51. The apparatus of claim 37, wherein said functional tester includes a cyclic redundancy check function tester for generating a digital code representative of the length and character of the serial digital data stream of said response signal, said code representing the signature of said response signal.

52. An in-circuit testing apparatus adapted for use with a computer for the in-circuit testing of the electrical properties of components in the circuit, the circuit having electrical nodes at which the components are interconnected, the apparatus comprising:
 (a) means associated with each of selected nodes, and responsive to the computer, for connecting each selected node to one of a plurality of signal lines associated with each selected node, each plurality of signal lines including a response signal line;
 (b) a digital test-signal generator associated with each said means, for generating a digital test signal for the circuit under test, the output line from each said generator comprising one of the associated signal lines for the node associated with said generator, said means
  (i) connecting one of said digital test-signal generators to a selected node, and
  (ii) connecting a selected node to the response signal line; and
 (c) a test controller responsive to the computer, for generating a test cycle in which digital test signals are applied to selected nodes, the circuit generating a signal on the response signal line in response to the applied test signals.

53. The apparatus according to claim 52 further comprising a functional tester for performing functional tests on said response signal to determine electrical properties of the components of the circuit.

54. The apparatus of claim 52, wherein said means includes:
 (a) a test pin contactable with an associated selected electrical node of the circuit;
 (b) a set of selectable switches connected to each of said test pins, for connecting each test pin to one of its associated signal lines; and
 (c) switch selecting means responsive to the computer, for selecting said selectable switches.

55. The apparatus of claim 54, wherein each said set of selectable switches includes a switch for connecting the output from one of said associated digital test-signal generators to its associated test pin.

56. The apparatus in accordance with claim 53, wherein said functional tester includes:
 (a) an analog-to-digital converter;
 (b) a counter for counting
  (i) the number of cycles in a clock signal that occurred when said response signal is at a logic high state, or
  (ii) the number of pulses in said response signal that occur in said test cycle; and
 (c) a cyclic redundancy check generator, for generating a digital code from the serial bit stream of said response signal, said code representing the signature of said signal.

57. The apparatus of claim 52, wherein said controller includes:
 (a) a system clock generator responsive to said computer for generating a master system clock for said tester;
 (b) a command decoder responsive to said computer for generating control signals to control the functions of said tester;
 (c) a listen enable generator responsive to said computer and said digital test-signal generators, for generating a listen enable signal, to enable said functional tester to perform functional tests on said response signal during the generation of said listen enable signal, and for controlling the length of said test cycle; and
 (d) a start test cycle generator responsive to said system clock, said command decoder and said listen enable generator, for starting and stoping said test cycle.

58. The apparatus of claim 54 wherein the set of selectable switches comprises a single switch which selectively connects its associated test pin to the response signal line, the output from each said test-signal generator being removably connected to its associated test pin whereby the associated test pin connected to the response signal line functions alternatively
  (a) as an input stimulus point to the circuit under test during the entire test cycle, or
  (b) as an input stimulus point for a first portion of the test cycle, and as an output response signal point for a second portion of the test cycle.

59. Apparatus adapted for use with a central processor for the in-circuit testing of the electrical properties of components of a circuit under test, said apparatus having a response signal line for monitoring the response signal from the circuit under test, the apparatus comprising:
  (a) electrical test pins, contactable with electrical nodes in the circuit;
  (b) a selectable switch associated with each test pin, for selectively connecting the associated said test pin to the response signal line;
  (c) a plurality of digital test-signal generators, one associated with each of said test pins, for generating at least one digital test signal from a set of test signals, the output line from each said generator adapted for connection to its associated test pin, each said digital test-signal generator including,
    (i) a memory address generator for generating a sequence of memory addresses during said test cycle,
    (ii) a first memory responsive to said address generator, for outputting a logic signal to select a digital test signal, said memory having a specified storage location for each digital test signal, said logic signal enabling a transition in said selected test signal,
    (iii) a second memory responsive to said address generator, for outputting a logic signal to enable and to disable the generation of said selected test signal,
    (iv) a synchronization signal generator responsive to said memory address generator for generating synchronization signals, and
    (v) a driver responsive to the output from said first and second memories, and to said synchronization signals, for generating the selected digital test signal and for applying said selected digital test signal to an electrical node of said circuit;
  (d) switch-selecting means responsive to the central processor, for selecting one said selectable switch to connect a node of said circuit to said response signal line;
  (e) a test controller responsive to the central processor, for generating a test cycle wherein selected ones of said digital test-signal generators supply test signals to said circuit, thereby to cause the circuit under test to produce a response signal on said response signal line; and
  (f) a functional tester connected to the response signal line and responsive to the central processor, for testing the signal on the response signal line, to determine electrical properties of the components of the circuit, said functional tester including,
    (i) an analog-to-digital converter,
    (ii) a counter for counting
      (1) the number of cycles in a clock signal that occurred when said response signal is at a logic high state, or
      (2) the number of pulses in said response signal that occur in said test cycle, and
    (iii) a cyclic redundancy check generator, for generating a digital code from the serial bit stream of said response signal, said code representing the signature of said response signal.

60. The apparatus of claim 59 wherein said selectable switch selectively connects its associated test pin to the response signal line, the output from each said test-signal generator being removably connected to its associated test pin, whereby the associated test pin connected to the response signal line functions alternatively
  (a) as an input stimulus point to the circuit under test during the entire test cycle, or
  (b) as an input stimulus point for a first portion of the test cycle, and as an output response point for a second portion of the test cycle.

* * * * *